US010526708B2

(12) United States Patent
Savas et al.

(10) Patent No.: US 10,526,708 B2
(45) Date of Patent: Jan. 7, 2020

(54) METHODS FOR FORMING THIN PROTECTIVE AND OPTICAL LAYERS ON SUBSTRATES

(71) Applicant: AIXTRON SE, Herzogenrath (DE)

(72) Inventors: Stephen E. Savas, Pleasanton, CA (US); Carl Galewski, Santa Cruz, CA (US); Hood Chatham, Scotts Valley, CA (US); Sai Mantripragada, Fremont, CA (US); Allan Wiesnoski, Pleasanton, CA (US); Sooyun Joh, Fremont, CA (US)

(73) Assignee: AIXTRON SE, Herzogenrath (DE)

( * ) Notice: Subject to any disclaimer, the term of this patent is extended or adjusted under 35 U.S.C. 154(b) by 53 days.

(21) Appl. No.: 15/918,215

(22) Filed: Mar. 12, 2018

(65) Prior Publication Data
US 2018/0202046 A1 Jul. 19, 2018

Related U.S. Application Data

(60) Continuation-in-part of application No. 15/169,988, filed on Jun. 1, 2016, now abandoned, which is a
(Continued)

(51) Int. Cl.
*C23C 16/509* (2006.01)
*G02B 1/18* (2015.01)
(Continued)

(52) U.S. Cl.
CPC .......... *C23C 16/509* (2013.01); *C23C 16/345* (2013.01); *C23C 16/401* (2013.01);
(Continued)

(58) Field of Classification Search
CPC ................................................ C23C 16/509
See application file for complete search history.

(56) References Cited

U.S. PATENT DOCUMENTS 4,230,515 A 10/1980 Zajac
4,314,180 A 2/1982 Salisbury
(Continued)

FOREIGN PATENT DOCUMENTS

DE 4242894 A1 6/1994
DE 102004043967 A1 3/2006
(Continued)

OTHER PUBLICATIONS

Babayan; et al., "Deposition of silicon dioxide films with a non-equilibrium atmospheric-pressure plasma jet", Plasma Sources Science and Technology (2001), 10:573-578.
(Continued)

*Primary Examiner* — Joseph A Miller, Jr.
(74) *Attorney, Agent, or Firm* — Ascenda Law Group, PC

(57) ABSTRACT

A method and apparatus are provided for plasma-based processing of a substrate based on a plasma source having a first, second and third electrodes disposed above a pedestal. The second electrode is disposed between the first and third electrodes. A first gap is formed between the first electrode and the pedestal and between the third electrode and the pedestal. A second gap is formed between the first and second electrodes, and a third gap is formed between the second and third electrodes. A first radio frequency (RF) power supply is connected to the first and third electrodes and is configured to predominantly deliver power to plasmas located in the first gap. A second RF power supply is connected to the second electrode and is configured to predominantly deliver power to plasmas located in the second and third gaps. In such a configuration, the power density of the plasmas located in the first gap can be independently controlled relative to the power density of the plasmas located in the second and third gaps.

20 Claims, 25 Drawing Sheets

Related U.S. Application Data division of application No. 13/921,969, filed on Jun. 19, 2013, now abandoned.

(60) Provisional application No. 61/661,462, filed on Jun. 19, 2012.

(51) Int. Cl.

| | | |
|---|---|---|
| *H01L 21/02* | (2006.01) | |
| *C23C 16/54* | (2006.01) | |
| *H01J 37/32* | (2006.01) | |
| *C23C 16/458* | (2006.01) | |
| *C23C 16/34* | (2006.01) | |
| *C23C 16/40* | (2006.01) | |
| *C23C 16/44* | (2006.01) | |
| *C23C 16/455* | (2006.01) | |
| *G02B 1/11* | (2015.01) | |
| *G02B 1/14* | (2015.01) | |
| *H01L 51/52* | (2006.01) | |

(52) U.S. Cl.
CPC ........ *C23C 16/4412* (2013.01); *C23C 16/458* (2013.01); *C23C 16/45563* (2013.01); *C23C 16/45574* (2013.01); *C23C 16/545* (2013.01); *G02B 1/11* (2013.01); *G02B 1/18* (2015.01); *H01J 37/32036* (2013.01); *H01J 37/32568* (2013.01); *H01L 21/0217* (2013.01); *H01L 21/02126* (2013.01); *H01L 21/02274* (2013.01); *G02B 1/14* (2015.01); *H01J 2237/332* (2013.01); *H01L 51/5253* (2013.01)

(56) References Cited

U.S. PATENT DOCUMENTS

| | | |
|---|---|---|
| 5,543,688 A | 8/1996 | Morita |
| 5,609,690 A | 3/1997 | Watanabe et al. |
| 5,686,360 A | 11/1997 | Harvey, III et al. |
| 5,757,126 A | 5/1998 | Harvey, III et al. |
| 5,981,899 A | 11/1999 | Perrin et al. |
| 6,198,217 B1 | 3/2001 | Suzuki et al. |
| 6,245,396 B1 | 6/2001 | Nogami |
| 6,262,523 B1 | 7/2001 | Selwyn et al. |
| 6,281,469 B1 | 8/2001 | Perrin et al. |
| 6,353,201 B1 | 3/2002 | Yamakoshi et al. |
| 6,359,250 B1 | 3/2002 | Blonigan et al. |
| 6,570,325 B2 | 5/2003 | Graff et al. |
| 6,573,652 B1 | 6/2003 | Graff et al. |
| 6,576,202 B1 | 6/2003 | Chiu |
| 6,579,805 B1 | 6/2003 | Bar-Gadda |
| 6,597,111 B2 | 7/2003 | Silvernail et al. |
| 6,660,409 B1 | 12/2003 | Komatsu et al. |
| 6,664,137 B2 | 12/2003 | Weaver |
| 6,720,203 B2 | 4/2004 | Carcia et al. |
| 6,743,524 B2 | 6/2004 | Schaepkens |
| 6,779,482 B2 | 8/2004 | Sakai et al. |
| 6,838,387 B1 | 1/2005 | Zajac et al. |
| 6,863,020 B2 | 3/2005 | Mitrovic et al. |
| 6,864,629 B2 | 3/2005 | Miyaguchi et al. |
| 6,897,607 B2 | 5/2005 | Sugimoto et al. |
| 6,916,401 B2 | 7/2005 | Long |
| 7,015,640 B2 | 3/2006 | Schaepkens et al. |
| 7,090,705 B2 | 8/2006 | Miyazaki et al. |
| 7,205,034 B2 | 4/2007 | Kawamura et al. |
| 7,264,849 B2 | 9/2007 | Keshner et al. |
| 7,319,295 B2 | 1/2008 | Mashima et al. |
| 7,342,361 B2 | 3/2008 | Ellingboe |
| 7,492,091 B2 | 2/2009 | Kharrazi-Olsson et al. |
| 7,510,913 B2 | 3/2009 | Moro et al. |
| 7,518,142 B2 | 4/2009 | Hoffmann et al. |
| 7,829,147 B2 | 11/2010 | Aitken et al. |
| 7,833,587 B2 | 11/2010 | Mashima et al. |
| 7,886,690 B2 | 2/2011 | Ellingboe |
| 7,951,620 B2 | 5/2011 | Won et al. |
| 8,236,424 B2 | 8/2012 | Schaepkens et al. |
| 8,257,799 B2 | 9/2012 | Lee |
| 8,298,625 B2 | 10/2012 | Stimson et al. |
| 8,343,592 B2 | 1/2013 | Kudela et al. |
| 8,359,250 B2 | 1/2013 | Srinivasan et al. |
| 8,404,502 B2 | 3/2013 | Won et al. |
| 8,486,487 B2 | 7/2013 | Fukuda et al. |
| 2001/0006093 A1 | 7/2001 | Tabuchi et al. |
| 2001/0021422 A1 | 9/2001 | Yamakoshi et al. |
| 2001/0042554 A1 | 11/2001 | Tamura |
| 2001/0050059 A1 | 12/2001 | Hongo et al. |
| 2002/0069971 A1 | 6/2002 | Kaji et al. |
| 2002/0148561 A1 | 10/2002 | Tetsuhiro et al. |
| 2003/0066485 A1 | 4/2003 | Yamazaki et al. |
| 2003/0070759 A1 | 4/2003 | Aota et al. |
| 2003/0079983 A1 | 5/2003 | Long et al. |
| 2003/0082313 A1 | 5/2003 | Chien |
| 2003/0113479 A1 | 6/2003 | Fukuda et al. |
| 2004/0096581 A1 | 5/2004 | Yashiro et al. |
| 2004/0137647 A1 | 7/2004 | Miyazaki et al. |
| 2005/0016457 A1* | 1/2005 | Kawasaki ............ C23C 16/452 118/723 E |
| 2005/0118533 A1 | 6/2005 | Mirkarimi et al. |
| 2005/0217798 A1 | 10/2005 | Sugiyama et al. |
| 2006/0096539 A1 | 5/2006 | Kawasaki et al. |
| 2006/0177599 A1 | 8/2006 | Madocks |
| 2006/0214270 A1 | 9/2006 | Iwagami |
| 2007/0217119 A1 | 9/2007 | Johnson et al. |
| 2007/0227662 A1 | 10/2007 | Yamazawa |
| 2008/0139003 A1 | 6/2008 | Pirzada et al. |
| 2008/0309242 A1 | 12/2008 | Ellingboe |
| 2009/0081360 A1 | 3/2009 | Fedorovskaya et al. |
| 2009/0117717 A1 | 3/2009 | Tomasini et al. |
| 2009/0244471 A1 | 10/2009 | Kondo |
| 2010/0080933 A1 | 4/2010 | Kudela et al. |
| 2010/0112235 A1 | 5/2010 | Prinz et al. |
| 2010/0136331 A1 | 6/2010 | Fahland et al. |
| 2011/0005461 A1 | 1/2011 | Vandermeulen |
| 2011/0005681 A1 | 1/2011 | Savas et al. |
| 2011/0005682 A1 | 1/2011 | Savas et al. |
| 2011/0006040 A1 | 1/2011 | Savas et al. |
| 2011/0262679 A1 | 10/2011 | Azuma et al. |

FOREIGN PATENT DOCUMENTS

| | | |
|---|---|---|
| JP | 2002212744 A | 1/2001 |
| JP | 2003093869 A | 4/2003 |
| KR | 10-2010-0129371 | 4/2016 |
| WO | WO 2006/120239 A1 | 11/2006 |
| WO | WO 2007/016999 A2 | 2/2007 |
| WO | WO 2008/055993 A1 | 5/2008 |
| WO | WO 2009/121975 A1 | 10/2009 |
| WO | WO 2011/006018 A2 | 1/2011 |

OTHER PUBLICATIONS

Brown, Sanborn C., "Basic Data of Plasma Physics", The MIT Press (Feb. 15, 1974), pp. 6-9, 36-37, 47-48 and 62-63.

Chow; et al., "Hydrogen content of a variety of plasma-deposited silicon nitrides", J. Appl. Phys. (Aug. 1982), 53(8):5630-5634.

Habraken; et al., "Silicon nitride and oxynitride films", Materials Sci. and Eng. (1994), R12:123-175.

Landheer; et al., "Growth and characterization of silicon nitride films produced by remote microwave plasma chemical vapor deposition", J. Vac. Sci. Technol. A (Sep./Oct. 1991), 9(5):2594-2601.

Lanford; et al., "The hydrogen content of plasma-deposited silicon nitride", J. Appl. Phys. (Apr. 1978), 49(4)2473-2477.

Lee; et al., "Development of Low Temperature Silicon Nitride and Silicon Dioxide Films by Inductively-Coupled Plasma Chemical Vapor Deposition", MRS Spring Meeting (1999), 11 pgs.

Loureiro; et al., "Non-equilibrium kinetics in N2 discharges and post-discharges: a full picture by modelling and impact on the applications", Plasma Sources Science and Technology (2011), 20:024007 (12pp).

Lucovsky; et al., "Deposition of silicon dioxide and silicon nitride by remote plasma enhanced chemical vapor deposition", J. Vac. Sci. Technol. A (May/Jun. 1986), 4(3):681-687.

(56) References Cited

OTHER PUBLICATIONS

Madocks; et al., "Plasma Enhanced Chemical Vapor Deposition (PECVD) for Large Area Applications", Preprint publication from the 53rd Society of Vacuum Coaters Annual Technical Conference 2010, 8 pgs.

Maemura; et al., "Particle formation and a-Si:H film deposition in narrow-gap RF plasma CVD", Thin Solid Films (1999), 345:80-84.

Moon; et al., "alpha, gamma, normal, abnormal glow discharge modes in radio-frequency capacitively coupled discharges at atmospheric pressure", Physics of Plasmas (2006), 13,033502-1-033502-6.

Moshkalyov; et al, "Deposition of silicon nitride by low-pressure electron cyclotron resonance plasma enhanced chemical vapor deposition in N2/Ar/SiH4", J. Vac. Sci. Technol. B (Nov./Dec. 1997), 15(6):2682-2687.

Nowling; et al., "Remote plasma-enhanced chemical vapour deposition of silicon nitride at atmospheric pressure", Plasma Sources Science and Technology (Feb. 2002), 11:97-103.

Park; et al., "Discharge phenomena of an atmospheric pressure radio-frequency capacitive plasma source", Journal of Applied Physics (Jan. 1, 2001), 89(1):20-28.

PCT/US2010/041440 International Search Report and Written Opinion dated Nov. 3, 2010, 26 pgs.

Roschek; et al., "High rate deposition of microcrystalline silicon solar cells using 13.56 MHz PECVD-prerequisites and limiting factors". Mal. Res. Soc. Symp. Proc. (2002), 715:A26.5.1-6.

Simon Selitser, "Plasma-Enhanced Deposition (of silicon dioxide) from TEOS and Oxygen", Time Domain CVD, Inc. (2002), 7 pgs.

Soppe; et al., "Roll to Roll Fabrication Process of Thin-Film Silicon Solar Cells on Steel Foil", ECN Solar Energy (2004), 4 pgs.

Stephens; et al., "The Optical Properties of Plasma-Deposited SiO2 and Si3N4 BRAGG Reflectors in the Spectral Range from 1.8 to 3.0 eV", Mat. Res. Soc. Symp. (1993), 281:809-814.

Strobel; et al., "Dynamic high-rate-deposition of silicon thin film layers for photovoltaic devices", 23rd European Photovoltaic Solar Energy Conference, Sep. 1-5, 2008, Valencia, Spain, pp. 2497-2504.

Takagi; et al., "Large area multi-zone type VHF-PCVD system for a-Si and uc-Si Deposition", 3rd World Conference Photovoltaic Solar Energy Conversion, May 11-18, 2003, Osaka, Japan, pp. 1792-1795.

Van Aken; et al., "Surface (Photo)Voltage Monitoring in Roll-To-Roll Deposition of Thin Film Silicon Solar Cells", 74th European Photovoltaic Solar Energy Conference, Sep. 2009, Hanaburg, Germany, 4 pgs.

Yota; et al., "A comparative study on inductively-coupled plasma high-density plasma, plasma-enhanced, and low pressure chemical vapor deposition silicon nitride films", J. Vac. Sci. Technol. A (Mar./Apr. 2000), 18(2):372-376.

Zimmermann; et al., "Inline dynamic deposition of A-SI:H and uC-SI:H thin-film solar cells", 25th European Photovoltaic Solar Energy Conference and Exhibition / 5th World Conference on Photovoltaic Energy Conversion, Sep. 2010, Valencia, Spain, 4 pgs.

Final Office Action dated Mar. 1, 2016, for U.S. Appl. No. 13/921,969, filed Jun. 19, 2013, 9 pgs.

Amendment filed Jan. 16, 2016, for U.S. Appl. No. 13/921,969, filed Jun. 19, 2013, 10 pgs.

Non-Final Office Action dated Sep. 18, 2015, for U.S. Appl. No. 13/921,969, filed Jun. 19, 2013, 13 pgs.

Final Office Action dated Oct. 11, 2017, for U.S. Appl. No. 15/169,988, filed Jun. 1, 2016, 12 pgs.

Amendment filed Aug. 31, 2017, for U.S. Appl. No. 15/169,988, filed Jun. 1, 2016, 21 pgs.

Non-Final Office Action dated Mar. 31, 2017, for U.S. Appl. No. 15/169,988, filed Jun. 1, 2016, 8 pgs.

\* cited by examiner

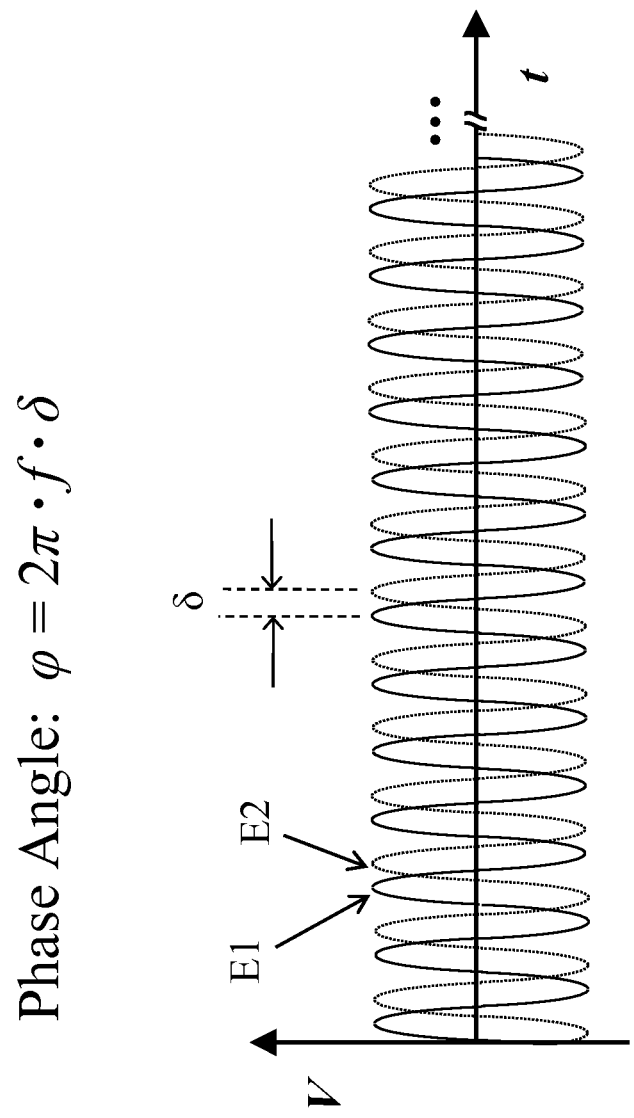
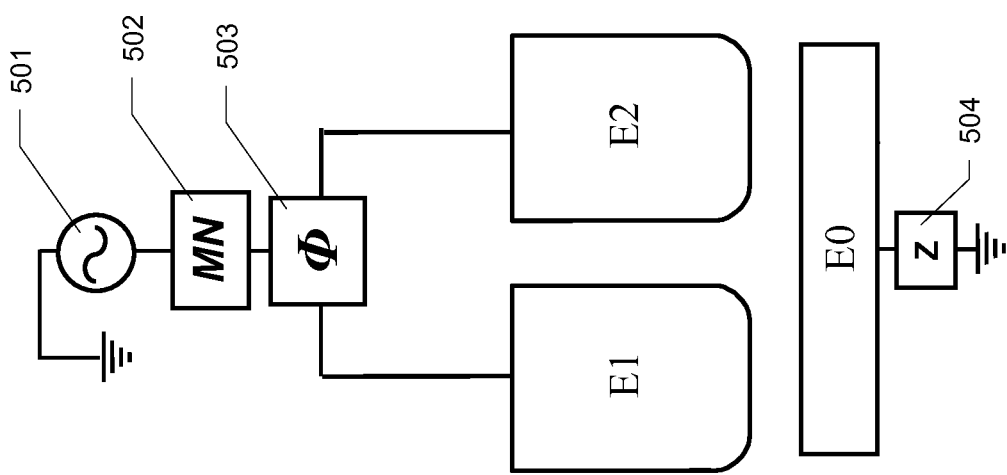
Fig. 5

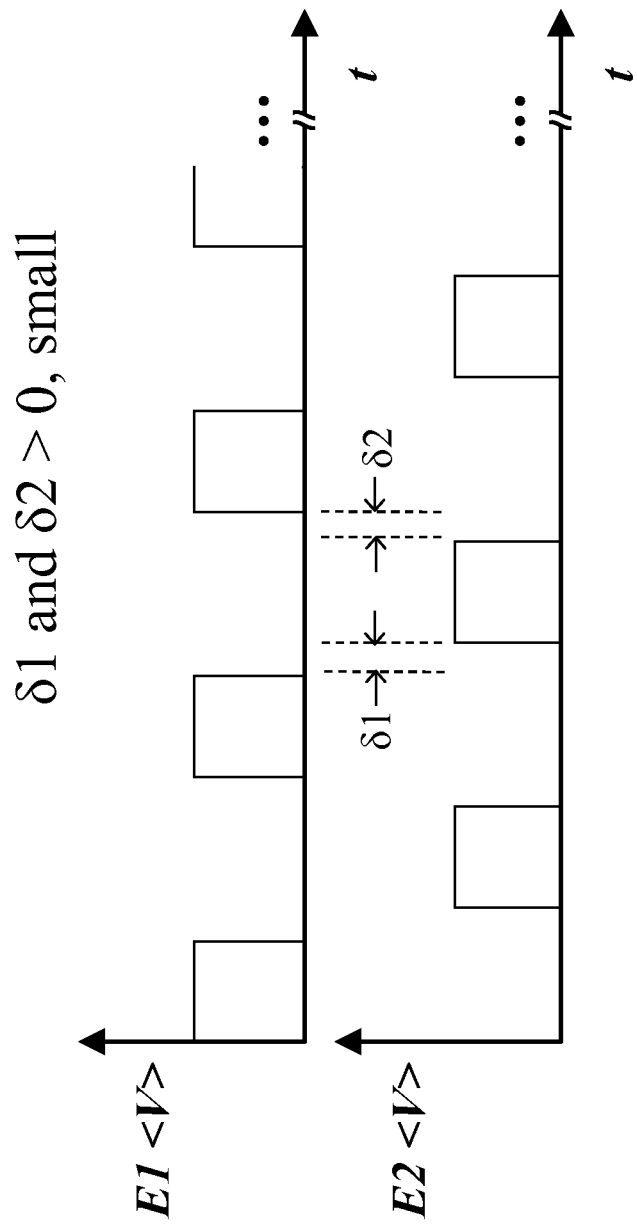

METHODS FOR FORMING THIN PROTECTIVE AND OPTICAL LAYERS ON SUBSTRATES

RELATED APPLICATIONS

The present application is a Continuation-In-Part of U.S. patent application Ser. No. 15/169,988 filed on Jun. 1, 2016, which is a Divisional of U.S. patent application Ser. No. 13/921,969 filed on Jun. 19, 2013, which claims priority to U.S. Provisional Application No. 61/661,462 filed Jun. 19, 2012, all of which are incorporated by reference herein.

FIELD OF THE INVENTION

The present invention in general relates to apparatus and methods for plasma processing, and in particular to alternating current powered plasma processing for ultra-clean formation of protective hermetic layers on small or large individual substrates, or large or continuous web substrates.

BACKGROUND

Currently, there are significant technical challenges in providing hermetic coatings or other protective layers on polymer materials, plastic substrates or sensitive inorganic materials. Some commercial applications are protective coatings for thin film photovoltaic panels, especially those having organic photovoltaic converting materials, or inorganic PV materials such as Copper Indium Gallium di-Selenide (CIGS) and others. Another major and challenging application is to form protective layers having very few defects or "pinholes" to cover active matrix OLED screens or lighting panels. Yet another application is to make anti-reflection or protective coatings on substrates.

In order for vacuum-based plasma coating process to be economically competitive the total cost for the deposition process must always be low enough that the products made using them are competitive. Such coating processes may be vacuum-based or atmospheric pressure processes using a liquid form to spread across the substrate. While liquid-based application may be cheaper to apply it often requires extensive drying/curing operations and usually cannot produce very thin coatings that are sometimes needed. In cases where coatings must be very durable or have special chemical bonding or optical properties they sometimes can only be made with vacuum-based plasma deposition processes. For various such applications there are widely differing cost requirements which may range from about $1/square meter for very thin hard coatings or amorphous silicon passivation coatings for photovoltaic panels, to more than $100/square meter for multi-layer dielectrics, or for thicker metal oxide or metal nitride coatings. In some cases, the manufactured product requires very large substrates to give the needed product performance or economy of scale. Good examples of such are thin film photovoltaic devices, films for windows or display screens. For a coating technology to be cost effective in such applications it must also be able to be scaled up while maintaining needed uniformity of coating properties for substrates two meters square in size, or larger.

One such type of critical application is for hermetic coatings for Organic Light Emitting Diode (OLED) materials for display screens or lighting. Such materials must be protected by very tight hermetic barriers for both oxygen and water vapor. Manufacturing of OLED or organic photovoltaics, is typically done on large substrates or continuous webs. Hermetic barriers, which must keep atmospheric gases out of a covered layer or substrate material, must be done at temperatures that do not damage the light emitting property of the polymer. Second, and equally important, is that, in the coating, there be extremely low defects that permit moisture or gases to come through the coating to damage the sensitive material underneath. Thirdly, the coating should be uniform in thickness and composition so that it has the same required properties over the entire area of the substrate and devices that will be made from it.

A low temperature coating process is required that also has extremely low defect density—much less than ten per square meter of substrate area—so that minimal areas are affected by the resultant leaks. For OLED devices the maximum tolerable temperature for deposition of needed hermetic barrier layers or overlying metal oxide layers, either conducting or semi-conducting, is between about 70° C. and about 90° C. Typically, barrier layers may include dielectrics such as silicon nitride or silicon oxynitride or other silicon-based materials, and in some cases, carbon based materials. Conducting metal oxides include zinc oxide, tin oxide, indium-tin oxide and some others. Semi-conducting metallic oxides are more complex typically using oxides of three metals—such as indium, gallium and zinc or indium, tin and zinc.

Other applications involve coating of plastics or polymer coated substrates. For some less temperature-tolerant polymers, such as PMMA, PVC, Nylon or PET, coating processes must be done with maximum tolerable temperature between about 75° C. and about 100° C. Among the common and useful coatings for such plastics are dielectric coatings for scratch resistance and optical coatings for anti-reflection as well as selective transmission of different bands of visible and infrared light. Coatings on some other more stable plastics such as PEN and epoxies must usually be done at temperatures less than 125° C. This is also a general upper temperature limit for some other polymers such as polystyrene used for organic photovoltaics and some semiconductor packaging applications. Acceptable processing temperatures are typically over 300° C. for glass, or up to about 300° C. for some few unusual plastic materials such as PFA or PEEK. Temperatures up to a limit of about 300° C. may be acceptable for depositing metal oxides on various metal substrates or webs. Currently, the leading process involves applying alternate layers of organic polymer and sputtered aluminum oxide. This process works well for small display but is not economical for larger screens due in large part to the limits defects introduced by the sputtering process. State-of-the-art defect density with sputtering is between about ten and fifty defects per $m^2$. This areal density of defects is not adequate even for screens as small as those for "pad" devices, let alone notebook computers where yields would be less than one good screen for per five manufactured.

The material needing protection may be of many types, including, but not limited to, organic materials or plastics for light emitting diodes, photovoltaic or solar concentrators, or inorganic materials used for electronics or photovoltaics. Substrate type may be silicon or other inorganic wafers, individual plates of glass or plastic, or be a long roll of material that is best processed continuously. Further, coatings applied using such technologies have general characteristics, strengths and limitations which make them more or less specific to each of the different types of applications.

Reactors for plasma enhanced coating of substrates include both cluster and in-line architectures. Deposition technologies including parallel plate PECVD, microwave plasma and sputter coating have been used for both conducting and dielectric thin films. Sputtering has been the most common type of deposition technology used for making very thin coatings at low temperature but this technology often has problems with cleanliness and can also cause excessive heating of the substrate due to the inability to remove heat from the substrate at the low reactor gas pressures required for sputtering processing. Sputter coaters have been used for many years for large and small substrates. Among those available have been in-line systems by manufacturers from Airco/Temescal to more recent systems from Veeco, FHR/Centrotherm, or Vitex Systems. PECVD is an alternative but has not been able to make good quality films at substrate temperatures less than about 200° C. Such systems include such as the Applied Materials cluster reactor for deposition of silicon and silicon nitride thin films in LCD screen manufacture, or in-line systems such the Roth & Rau system for coating solar cell wafers with silicon, or dielectrics such as silicon oxide. Scaling such reactors to process ever larger substrates has made it increasingly difficult to maintain the desired film properties and uniformity of thickness of the coating across the entire substrate.

Dielectric coatings at temperatures below about 200° C. are generally deposited by sputter processes. Sputtering can be used for coatings at even at lower substrate temperature, below 100° C., but the deposited films often exhibit a columnar structure. The columnar structure is not desired for barrier films since the defective region surrounding each column extends across the thickness of the film allowing for high rates of diffusion/penetration by gas or liquid. Accelerating ions towards the substrate by applying bias during the sputtering process adds energy to the atoms on the surface of the depositing film. The added energy by impinging ions allow the atoms on the surface of the depositing film to move around, providing for a more isotropic film structure and higher film density. However, the low process chamber pressure during sputtering makes it difficult to dissipate the heat added to the substrate by impinging ions. The methods to control substrate temperature during sputtering developed for integrated circuit processing, such as electrostatic chucks and backside He flow, are not practical or economical for substrates that are large, made from dielectric materials, or continuously moving. RF plasma-based PECVD on the other hand tends to make denser films with more controllable stress and amorphous structure but typical implementations require substrate temperatures above about 180° C. The elevated substrate temperature is required to complete the chemical reactions involved in the deposition process to reduce incorporation of unwanted species such as hydrogen, water, and un-reacted precursor ligands. Increasing the RF frequency above the typical 13.56 MHz may improve the efficiency of breaking down the precursors and completing the chemical reaction. For example, microwave deposition systems typically produces coatings at a higher rate and more efficiently from the gas feedstock, but the coatings tend to be less dense, more tensile in film stress and may not adhere well to the underlying material.

In RF-plasma-based PECVD gas phase particles typically become negatively charged and suspended away from the substrate in high field regions at the plasma/sheath boundaries. In addition the internal surface of a plasma based process chamber can also be conveniently cleaned by running a plasma based chamber clean recipe. By injecting process gasses that can be activated to etch away deposits inside the chamber that can flake off and become particles or defects on the processed substrates. The intervals between chamber cleans are determined as a balance of maximizing productivity against the chance that accumulating of deposits inside the process chamber creating particles on the substrate. The plasma distribution during the processing step can be made to match the distribution during the cleaning process ensuring that cleaning is efficiently performed by focusing on the areas that need cleaning the most. The excellent particle performance of plasma based processes is demonstrated in semiconductor manufacturing of nanometer scale devices where less than about 5 particles larger than 50 nm size on wafers of 300 mm diameter is a normal operating result. Sputtering processes and chambers typically have particle densities on substrates an order of magnitude greater than plasma based processes. The reason is that in sputtering systems there is no inherent tendency for particles to be captured before ending up on the substrates and in-situ cleaning methods are not as easily incorporated in to sputtering systems. Chamber cleaning for sputtering systems is typically based on switching out internal shield surfaces inserted in the process for the purpose of absorbing deposition fluxes that do not end up the substrate. The films ending up on these shield surfaces may be come stressed and prone to flake off, causing large particle "dumps" on to the substrates. Cleaning of sputtering systems also takes longer because each time the process chamber must be vented, opened, parts replaced, maybe some manual wiping, closed back up, and pump/purged to get back to production.

The prior art does not provide deposition systems that can deposit dense quality encapsulation films at high-rate and low-cost with low defect density while at the same time maintaining temperatures below 100° C. There is, therefore, a need for improved processing technology to meet these needs and at the same time be compatible with high-volume production.

SUMMARY OF THE INVENTION

Enhanced process control of plasma and gas properties in plasma sources (also called linear plasma generating units—PGUs), and properties of deposited films of various types are provided herein. A plasma source is also provided having multiple plasma regions that impart improved control of plasma energy and gas composition in such regions. Such improved local control of reactive species generation and how these species interact with a substrate to be processed in proximity to the source permit superior control of deposited film properties when the substrate temperature during deposition is decreased, particularly below about 150° C. In some embodiments the radio frequency (RF) or VHF voltage from one or more power supplies is distributed to electrodes within a plasma source or PGU by adding a circuit or transformer that can insert a phase angle between the frequency components of the voltage on adjacent electrodes. The phase and distribution of frequencies—as well as the gaps between electrodes relative to their gaps to the substrate—controls the relative magnitude of plasma energy density between the electrodes versus that between electrodes and the substrate. For some implementations the cross-sectional shape of each electrode may be used to create regions of increased or reduced plasma power density. Thus, in some example embodiments regions of the plasma that are desired to have higher power density may have a closer spacing of electrodes from one side of that plasma region to either an electrode or to a passive surface (such as a grounded surface or substrate) on the opposite side. In some example embodiments the RF or VHF power signal delivered to adjacent electrodes may be pulsed with relative timing to alter the chemistry and/or spatial distribution of the plasma surrounding the electrodes.

In some inventive embodiments, a non-powered electrode may inserted between powered pairs of electrodes. In some implementations this electrode may be grounded, in others it may be connected to ground via a circuit with a desired impedance so that the electrode voltage has the desired characteristics. The non-powered electrode decouples the two powered electrodes to create different plasma conditions for the region used for precursor decomposition and region used for substrate deposition. Alternatively an impedance circuit can be connected to this electrode to establish a bias relative to the adjoining electrodes.

In other inventive embodiments, an additional bias inducing electrode is positioned on the opposite side of the substrate being coated so that it increases ion bombardment power and ion energy on some part of the area of the substrate during coating. By making such a bias electrode much smaller in area than the upper electrodes it provides concentrated ion bombardment energy onto the substrate rather than onto electrodes or insulators. This additional lower electrode can be powered independently, or by the same circuit as the electrodes of the plasma source/PGU by connection to an RF or VHF supply. In embodiments where the lower electrode is separately powered the ion bombardment power for the growing substrate can be more accurately and efficiently controlled.

In other inventive embodiments, an inert or deactivating gas is injected next to a more reactive precursor. This inert or deactivating gas may either serve as a diffusion barrier reducing the reactive species concentration in the volume close to the injection point. This can help reduce undesirable deposition and build up that may occur on electrode or divider surfaces next to the precursor injection point.

In other inventive embodiments, the non-powered electrode is used to create a region free of reactive radicals next to the substrate surface and surrounding the outlet for precursor gas injection. The radical free region allows the substrate to be exposed to a precursor chemical before the adsorbed precursor is made to react on the substrate surface by an adjacent plasma region. Other configurations of precursor injection also allow precursor to be injected closer to the substrate and toward it so that unreacted molecules have a significant chance of adsorbing on the substrate surface and due to their mobility on the surface they produce more conformal coatings. After said precursor molecules are adsorbed on the surface they can react with both neutral reactive species and potentially with reactant ions that bombard the surface. In the source architectures disclosed herein such surface reactions are typically taking place as the substrate moves under the "nozzle region" between electrodes where activated reactant issues from the gap between a pair of powered electrodes of a source.

The invention should not be considered limited to the specific combinations of electrodes and gas injection nozzles disclosed in particular drawings but may also include combinations of gas nozzles and electrode designs not shown. Further, the invention should not be considered limited to combinations of electrode designs and configurations with particular RF or VHF power provision or phase relationships.

BRIEF DESCRIPTION OF THE DRAWINGS

FIG. 5 depicts a diagram illustrating a phase splitter inserted between a single RF supply and source that provide waveforms to each electrode with a specified phase relationship between them that can be used to vary the intensity between the plasma regions that promote dissociation and deposition.

FIG. 8(B) depicts a timing diagram illustrating the case when the RF pulses sent to two electrodes in a source has a delay, during which neither electrode is receiving RF power.

DETAILED DESCRIPTION OF THE INVENTION

The present invention has utility in applying PECVD technology with its established benefits in low defect coatings in novel configurations that ensures the complete reaction of precursors to form high quality thin films on substrates at temperatures below 100° C. The present invention provide enhanced control of plasma properties and gas flow in the linear plasma sources, also called plasma generating units herein.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

Figure 1:
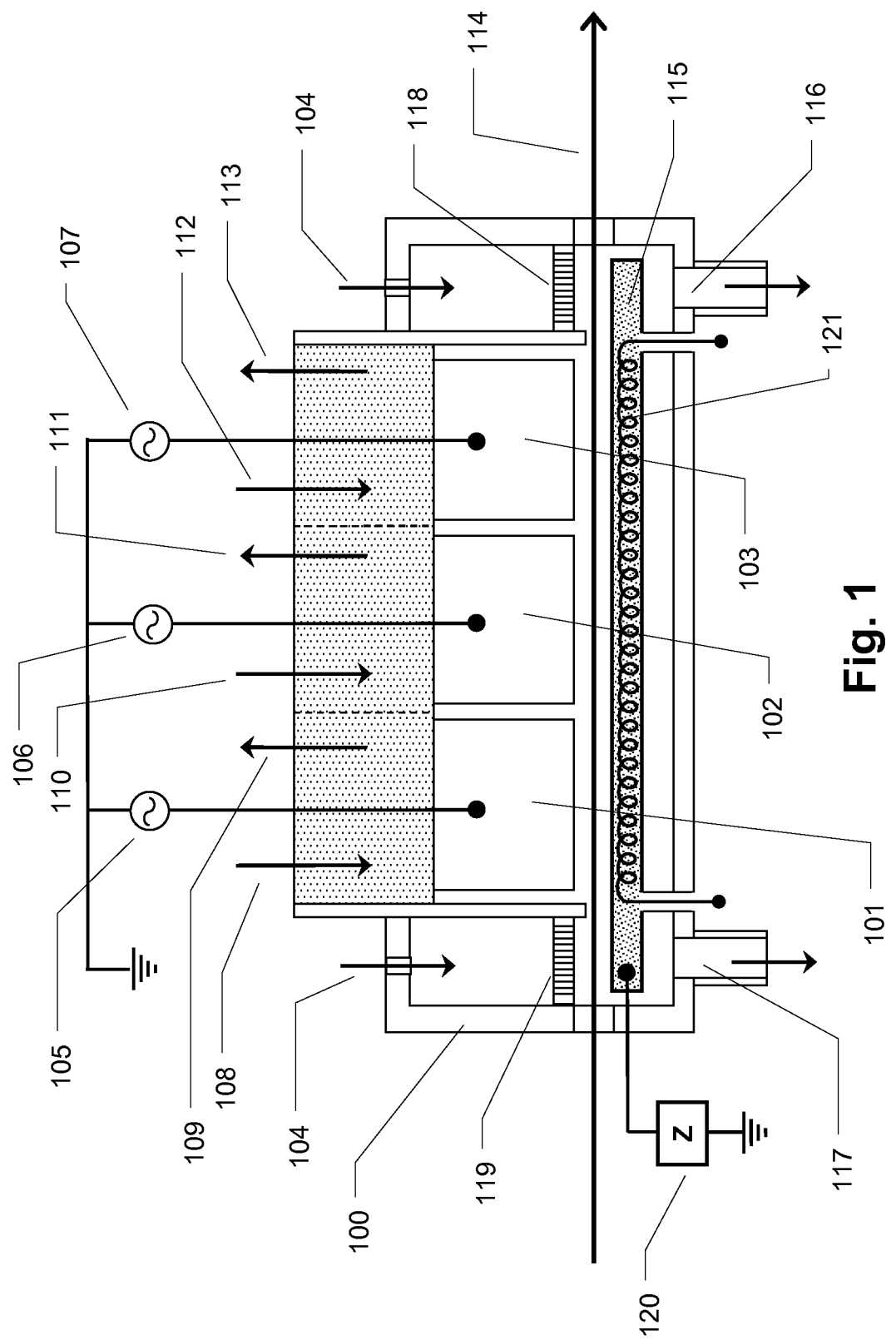
FIG. 1 depicts a configuration of the invention illustrating its use to process a moving substrate, showing as an example module with 3 plasma sources (also called Plasma Generating Unit—PGU).

An exemplary embodiment of a substrate processing chamber with multiple sources is shown in FIG. 1. There may be any number of sources in a processing chamber and one or more chambers in a processing unit, and source may be of similar or different designs as required to accomplish a sequential series of processing steps on a substrate 114 moving through a chamber. FIG. 1 illustrates a processing chamber with only 3 sources only to simplify the following discussion without limiting the scope of the invention. The 3 sources 101, 102, and 103 will have inlets for each receiving multiple types of inert and reactive gases at various flows 108, 110 and 112, respectively. Each source also is provided with an exhaust to exhaust gases and reaction byproducts 109, 111, and 113. Each source is also provided at least one supply of RF power 105, 106, and 107. RF power to one or more electrodes of one or a group of sources may be provided by multiple power supplies, or by splitting the RF power from a single power supply. In some embodiments the RF power may be split to supply electrodes of multiple sources in parallel. The inventions described herein control how gases and RF power are distributed inside each individual source to enable consistent and controlled processing of substrates conveyed through the processing unit.

Figure 2:
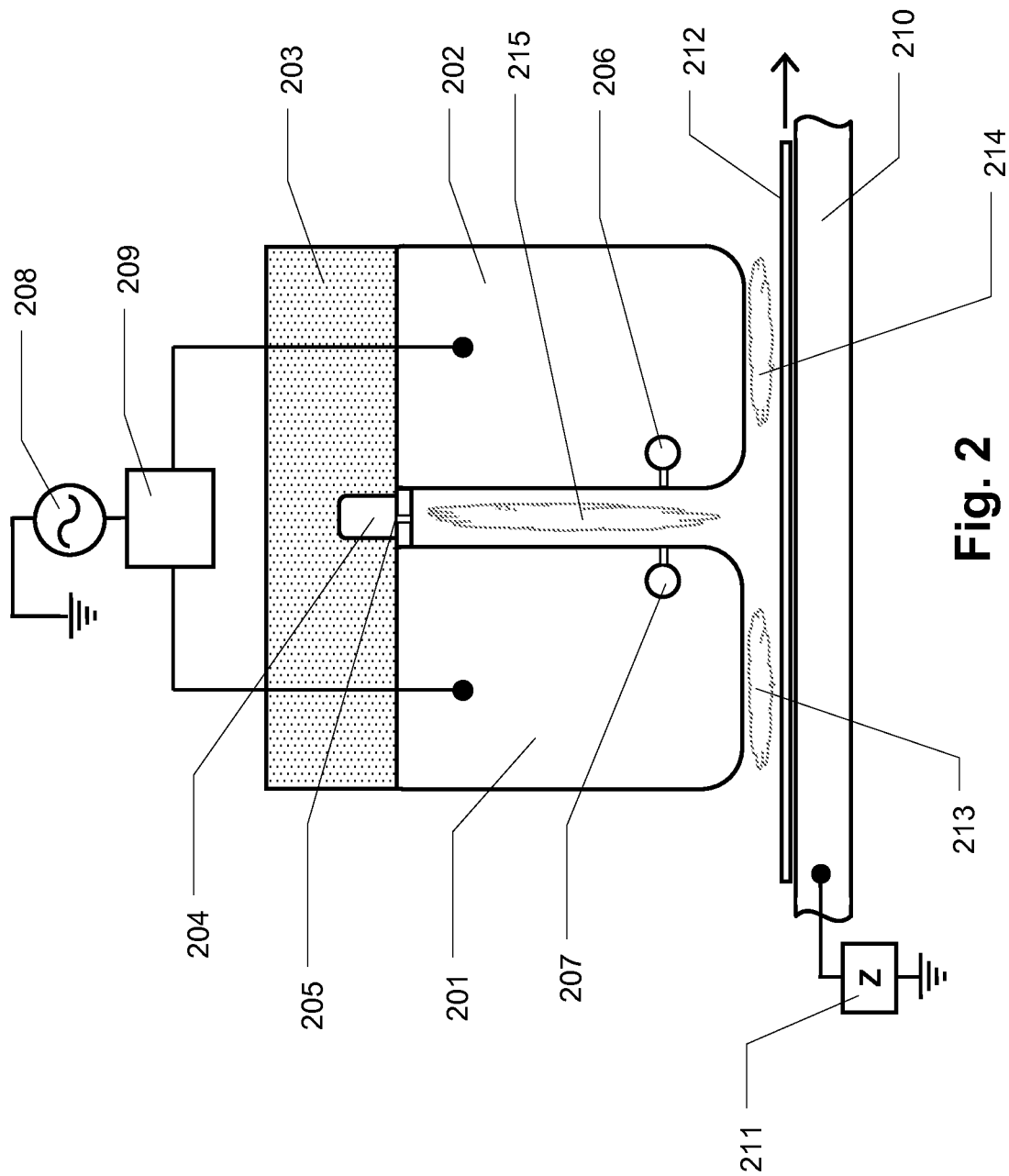
FIG. 2 depicts a diagram illustrating in cross-section an exemplary configuration of a two electrode source, showing the combination of electrode shape, RF connection, and gas injection locations multiple plasma regions for dissociation and deposition, respectively.

FIG. 2 illustrates in cross-section an inventive embodiment having at least one two-electrode source with two mirror image electrodes 201 and 202 mounted to an insulating support 203. Such a plasma source/plasma generating unit design may in some embodiments be used for depositing high quality amorphous oxide or nitride films at very low substrate temperatures less than about 90° Celsius, and even less than 70° Celsius. An internal gas channel 204 and distribution manifold 205 allow for a first gas, which may be a mixture of component gases, to be injected in the gap 215 between the two electrodes. In operation, the first gas may be injected near the top of the gap between electrodes from a reservoir within one or both electrodes rather than from the reservoir in an insulating structure as shown in FIG. 2. In other modes of operation at least one additional or second gas, which may be a mixture of component gases distinct from that of the first gas, is injected closer to the substrate in the same gap, 215, via holes or one or more slots from gas channels 206 and 207 inside the electrodes. The distance between the injection points for the first and second gases may in some embodiments be an appreciable fraction of the height of the electrodes. Whether this is the case or not, the height of the electrodes 201 and 202 most suitable for a given type of film deposition in general will depend on the type of reactant gas injected from manifold 205 as well as the gas pressure, gap between electrodes and power density deposited into this plasma.

For deposition of silicon nitride and other nitride films at any substantial rate (more than about 20 nm per minute), using $N_2$ gas as the only, or majority by weight nitrogen atom source for incorporation into deposited films, the height of the electrodes should generally be greater than the height when using ammonia ($NH_3$) gas as the only or predominant nitrogen source for film nitride. In general, the electrode height optimal for depositing materials using hard-to-dissociate reactant species, such as nitrogen gas, is greater than the height for reactants that are easier to dissociate such as ammonia, oxygen or nitrous oxide. This is because nitrogen being much harder to dissociate (9 eV minimum energy provided to break the triple bond between nitrogen atoms), requires a longer time in a plasma to have a given probability of generating nitrogen atoms. In general, higher power density in the gap between electrodes may be used and/or a lower gas pressure to promote faster dissociation, but sufficient length of the channel down which the gas flows through the plasma is needed to produce an adequate flux of nitrogen atoms for moderate to high deposition rates of high quality nitride materials. See Table I for approximate ranges of gas pressure, power density and electrode height—appropriate as functions of the application, silicon based-dielectric film type, reactant type and other process conditions—to achieve adequate reactant atom production for desired film deposition rate and film quality. The relation between such control parameters as RF or VHF power density, gas pressure, gas type, gap between electrodes, and desired deposition rate is complex and can only be determined accurately by experimentation. Ranges of plasma parameters in Table I are sufficient in the large majority of cases when the RF or VHF power is in the upper end of the stated range. Said table should not be construed to be limited in validity to the source or PGU configuration of FIG. 2 but may also be applicable to alternative embodiments of the plasma source or PGU.

Table I—Source Power, Gas Pressure and Electrode Height Ranges for deposition processes of silicon oxide and silicon nitride.

oxide, or other oxygen containing gas such as water vapor or other nitrogen oxides. Such gases may also be used in example embodiments for depositing metallic oxides or mixed oxides having more than one metal constituent which may be electrically conducting or semiconducting. For depositing silicon nitride or other nitride materials, in particular inventive embodiments, reactant gas injected from manifold 205 might include nitrogen, ammonia or others, such as hydrazine, that contain nitrogen but not oxygen.

The precursor gases injected from manifolds 206 and 207 for depositing silicon oxide films might in example embodiments include at least one of the gases: silane, disilane, higher silane compounds, and methylated silane compounds, tetraethyl-ortho silicate (TEOS), hexamethyldisiloxane (HMDSO), tetramethylcyclo-tetrasiloxane (TMCTS), bis(tertiary-butylamino)silane (BTBAS), vinyltrimethylsilane (VTMS) or other silicon containing compounds with substantial vapor pressures at temperatures less than about 80° C. For example, in inventive embodiments depositing silicon nitride the gas injected from manifolds 206 and 207 illustratively include silane, disilane or higher silanes, methylated silanes, hexamethyl disilazane (HMDS or HMDZ) or other silicon containing compounds with sufficient vapor pressure and not containing oxygen.

For some example embodiments the gas injected from manifold 204 may include inert gases, such as helium, argon, neon, krypton, and xenon. In this case the injected gas is activated by the plasma to produce meta-stable species that can efficiently transfer that energy to molecular species in the gas phase, thereby promoting the formation of reactive radical species that then react with precursor species injected into the plasma region. In some inventive embodiments there may be a reactant gas that is also injected into the space between electrodes 201 and 202, either from manifold 204 or from manifolds within the electrodes 201 or 202 or both,

TABLE I

Electrode Height vs Film Type, Gas Type, Gas pressure, Gap and Power Density

| Application/ Precursor | Reactant Source Gas | Film Deposition Rate | RF or VHF Power Density | Gas Pressure | Electrode Height |
|---|---|---|---|---|---|
| Silicon Nitride deposition/silane, methylated silane or HMDZ | Nitrogen | 20 nm/min to 200 nm/min | 0.3 Watt/$cm^2$ to 3 Watts/$cm^2$ | 20 Pascals to 1000 Pascals | From 40 mm to 300 mm |
| Silicon Nitride deposition/silane, methylated silane or HMDZ | Ammonia | 50 nm/min to 500 nm/min | 0.1 Watt/$cm^2$ to 3 Watts/$cm^2$ | 40 Pascals to 1000 Pascals | From 20 mm to 200 mm |
| High rate deposition of carbon-doped silicon dioxide for flexible Encapsulation/HMDSO, TEOS, TMCTS or methylated silence precursor | Oxygen gas | 50 nm/min to 500 nm/min | 0.1 Watt/$cm^2$ to 3 Watts/$cm^2$ | 20 Pascals to 500 Pascals | From 20 mm to 150 mm |
| High rate deposition of carbon-doped silicon dioxide for flexible Encapsulation/HMDSO, TEOS, TMCTS or methylated silence precursor | Nitrous oxide, ozone | 50 nm/min to 500 nm/min | 0.1 Watt/$cm^2$ to 5 Watts/$cm^2$ | 20 Pascals to 500 Pascals | From 20 mm to 120 mm |

In some example embodiments for depositing silicon oxide or other oxide materials, the gases introduced from manifold 205 may contain reactant gas or gas mixture having one or more components such as oxygen or nitrous in the region 215 between the injector aperture 205 and apertures 206/207. In either case, once the reactant gas has been injected into the plasma present in the region 215 it begins to dissociate so as to produce the desired reactive radicals that then react with the precursor, producing the species for depositing the desired encapsulation layer or coating.

These electrodes 201 and 202, as shown, have rounded edges for the side facing the substrate to ensure smooth gas flow around the electrode without causing gas flows in recirculation loops. This also has the effect of reducing electric field enhancement at the corners that may create undesirable intense local plasma regions and gas recirculation. In some inventive embodiments, the rounding may have a small radius so as to promote some degree of plasma enhancement in the region between electrodes adjacent the substrate, with a small radius being defined as shown in the drawings compared to the length of an electrode face of approximately ⅕ or less relative to the electrode face length. In some inventive embodiments, cross sectional shapes of rounded edges are segmented or arcuate. Each may have two or more arc segments with different curvature radii in the range between about 3 mm and 20 mm.

In some inventive embodiments, the output from at least one RF or VHF power supply 208 provides ac power to both of the two electrodes by using a splitter 209. In some example embodiments RF and/or VHF generators with different frequency outputs can have outputs combined in connecting to the electrodes. In some such cases there can be different frequency RF or VHF power fed to each of the electrodes, or power of each such frequency may be split or transformed before being combined with other frequency components and connected to each electrode. In other inventive embodiments, for a component frequency of RF or VHF power supplied to both electrodes, a phase difference may be introduced between the current supplied to the two electrodes. Such phase difference changes the relative power density in the plasma region between said electrodes to that between the electrodes and the substrate. The power densities are also strongly affected by relative size of the gap between electrodes compared to that between electrodes and substrate. The thickness and material properties of the substrate are also influential on the power absorption into the plasma between the substrate and electrodes. This serves to vary the proportion of the electrical power that goes into the fragmentation of the reactant gas between said electrodes and the power density of ion bombardment of the film growing on the surface of the substrate. A phase difference of approximately 180° results in the maximum power injection into the gap between electrodes and the minimum injection into the plasma between electrodes and substrate. This means that when the phase difference between electrodes is close to 180°, the voltage difference between electrodes is a sinusoid with amplitude about twice that of the voltage on either electrode, whereas a phase difference of 90° makes the difference between the electrodes only about 40% greater than the voltage on either electrode. When the phase difference is 60° the voltage difference between electrodes is the same magnitude as that on either electrode. Making the reasonable approximation that the power deposition into a plasma increases faster than proportional to the square of the voltage, the power density deposited in the plasma between electrodes can be tuned very substantially by changing the phase difference between electrodes.

Combination of power at different frequencies to the electrodes has several possible benefits for exemplary applications of the invention. The higher RF frequency components deposit more of the injected power into ionization and dissociation of the gas whereas the lower frequency component tends to increase sheath voltages and thereby deposit more power into the ion bombardment of the electrodes—though possibly not the substrate if it is made of dielectric material.

Opposite the gap formed between the two electrodes is a temperature controlled pedestal 210 that may be connected directly to ground, or connected via a circuit 211 having some electrical impedance, z, to ground. The pedestal provides the support and means to move a substrate 212 at a controlled distance below the two electrodes to form two gap regions 213 and 214. Depending on the type of substrate, it may move under the PGU's directly or be supported on a moveable substrate carrier. The spacing between substrate and pedestal support may be controlled by a mechanical mechanism, low friction areas on the pedestal directly contacting the substrate or substrate carrier, or gas bearing arrangement using the pedestal support as a conduit for the required gas inject ports and exhausts. The benefit of this PGU configuration is to form a pre-processing region where a first gas mixture injected from support channel 204 can be activated by plasma, dissociating and/or ionizing molecules in the gas mixture. The activation of the first gas mixture provides the benefit of increasing the efficiency of chemical reaction with a second gas mixture injected closer to the substrate from gas channels 206 and 207. The more efficient chemical reaction between gas species provides the benefit of more fully reacted compounds of the precursor on the substrate with less need for direct substrate heating to remove undesirable species that would otherwise be incorporated. This makes the invention suitable for coating temperature sensitive substrates with dense fully reacted barrier films, such as, for example, OLED displays, plastic, and flexible substrates of various kinds.

To take advantage of this opportunity, the invention also provides in certain embodiments, a controller for controlling the chemical reactions in the gas-phase. There are three features of the source that enable this improved control, which is not possible in parallel plate PECVD reactors. First is the injection of different gases into the gap between electrodes at different distances from the substrate, with a resulting order of introduction of the different molecular species along the flow path of gas in the reactor. This determines the sequence of plasma activation for the different gases injected. Second, the amount of power injected into the plasma between the electrodes, 215, is independent of that injected between electrodes and substrate, 213 and 214. It is the power injected between electrodes, along with the injection order of gases that determines the sequence of gas phase reactions between the gas species. Third, that the injection of gas and the pumping in the exhaust are distributed uniformly along the length of the source, which cause the gas flow paths in the source to be substantially perpendicular to the electrode length and independent of the position along the length of the source, improving process uniformity and facilitating scaling to very large (several meter) electrode and substrate sizes.

Some processes that rely on break down of a hard to dissociate precursor, such as nitrogen, may benefit from high plasma energy density in the gap between the electrodes to accelerate the precursor activation reactions. Other processes that involve more easily dissociated reactant gases, such as ammonia, may benefit from high plasma energy in the gap between electrodes and the substrate to add more energy to the plasma adjacent the substrate and to ion bombardment of the substrate.

In some inventive embodiments, injectors for the precursor may be located on the bottom of electrodes, instead of injecting into the gap between electrodes as shown in FIG.

2. In some example embodiments the plasma in the gap between the electrodes and the substrate, 213 and 214, may be of reduced power density relative to that between electrodes, 215, so that the plasma between electrodes and substrate is not as dense and does not cause rapid dissociation or ionization of the injected precursor gas. In some deposition processes where a conformal coating is desired it is preferable for the precursor gas, whether silicon or metal containing, to adsorb on the substrate surface prior to being reacted or dissociated by the plasma. In this case the precursor molecules are more often mobile when adsorbed on that surface and provide for improved step coverage or conformality of the grown film on the topography of the substrate. In particular inventive embodiments, it is desirable for the precursor gas to have smaller probability of being dissociated or ionized after injection into the plasma volume prior to reaching the substrate surface. After being coated with precursor the substrate may move so that just-coated areas are directly under the gap between electrodes, 215, where they are subjected to direct flow of the activated reactant species emergent from the gap between electrodes and to enhanced ion bombardment resulting in growth of the desired oxide or nitride material.

Figure 3:
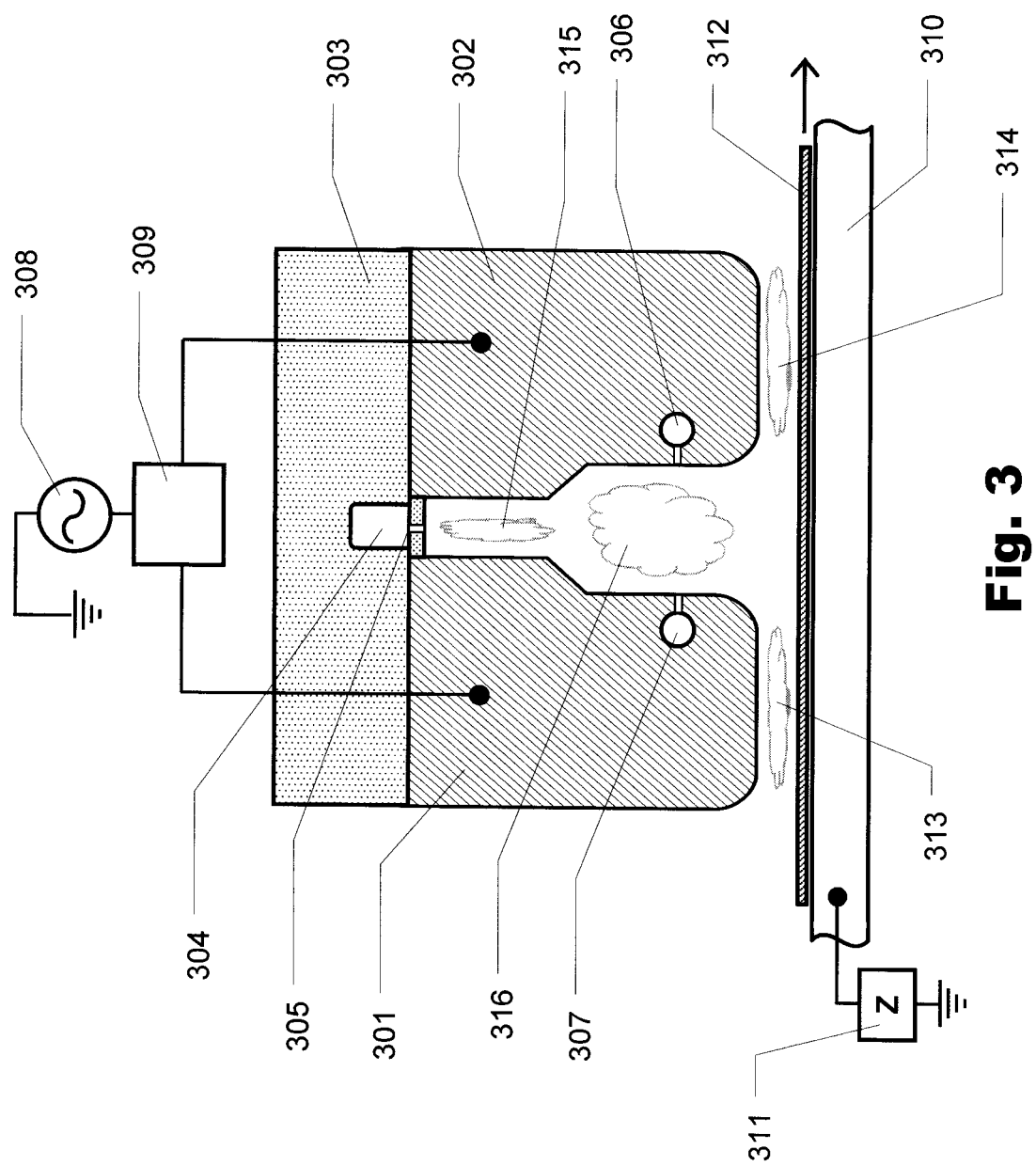
FIG. 3 depicts a diagram illustrating a narrower gap region between two electrodes in a source close to the upstream injection of a first source gas to increase the plasma energy in that region and enhance the decomposition and/or reactivity of that first source gas.

For some processes there may be an additional benefit of tailoring the plasma energy in the volume between the electrodes at the injection point of the first gas relative to that in the volume receiving the second gas mixture. For example, the amount of plasma energy appropriate to break down and/or activate the first gas, which in some embodiments is the reactant, may cause undesirable effects if applied to the second gas mixture (in some embodiments the precursor) such as causing it to react too quickly and deposit on the electrode surface and/or in the gas phase directly. In the embodiment illustrated in cross-section in FIG. 3, the narrower gap 315 is at the top, close to the injection point of the first source gas, and the wider gap 316 is at the lower portion, at the injection point of the second gas. In other inventive embodiments, the process may be used to deposit silicon nitride using nitrogen gas, the main nitrogen source, as a component in the first gas, and silane as the precursor, a component of the second gas. The nitrogen, being very hard to dissociate into the required nitrogen atoms (to form stoichiometric silicon nitride) benefits from the higher power density in the plasma in the narrow gap region in providing needed nitrogen atoms, whereas in the region of precursor injection where there is a larger gap between electrodes the lower power density plasma meets the need of the process. If ammonia gas is used as the nitrogen source it requires much less power to provide nitrogen atoms so that greatly increased plasma power density in the volume receiving the injected first gas is not needed. The profile, as shown in FIG. 3, transitions the gap width smoothly so as to maintain gas flow without recirculation. The plasma volume having a narrower gap between electrodes 315 will in general have a higher power density because the electrical resistance and overall impedance of the plasma there is less than in plasma volumes such as 316 where the separation of the electrodes is larger. In general, the proportion of total RF power dissipated in the various regions having differing width between two electrodes is by Ohms law inversely proportional to the total impedance of the plasma in each region. Thus, in regions where the gap is smaller such as 315 there is lower plasma reactance due to a thinner sheath, and lower resistance due to higher electron density, which means the RF current density is higher and the plasma power density is higher. In general, the power density between electrodes decreases as the gap increases, roughly as the inverse square of the gap size. Thus, two electrodes having a gap in a first region half the size of the gap in a second region will produce a plasma in the first region having about four times the power density per unit surface area of an electrode. Per unit volume the region with a smaller gap will have more than 8 times the power density of the plasma in the region with the larger gap. This means that the rates of dissociation or ionization in the region with a narrow gap can be much higher than in the region with a gap twice that size.

In the case of nitrogen gas, $N_2$ as the main reactant in the first gas for deposition of silicon nitride, example embodiments of the invention may be such that the gap 315 may be between about a fourth and about two thirds of the gap 316. This means that the power density for dissociating the nitrogen in 315 may be between about two times to ten times the power density in 316. Typically, this power density ratio may be nearer the low end of the range when the source power is high (greater than about 1 kiloWatt per meter of source length) and the required film deposition rate is low (less than about 500 Å/minute). However, when high rates of film deposition are deposited larger amounts of atomic nitrogen are needed and the ratio of power density for highest quality nitride films will be toward the upper end of the above range. On the other hand, when nitrous oxide is used as reactant for deposition of silicon dioxide then the ratio of the gap in the upper part of the space between electrodes where the reactant is activated to that where the precursor is injected may be between about a half and unity. This is because the power density required for dissociation of nitrous oxide to produce oxygen atoms is much lower than for oxygen gas or other oxygen sources and therefore, it is relatively easy to dissociate the gas and produce ample atomic oxygen to fully oxidize the precursor and produce stoichiometric silicon dioxide when ammonia is used as the nitrogen source for forming nitride films.

Figure 4:
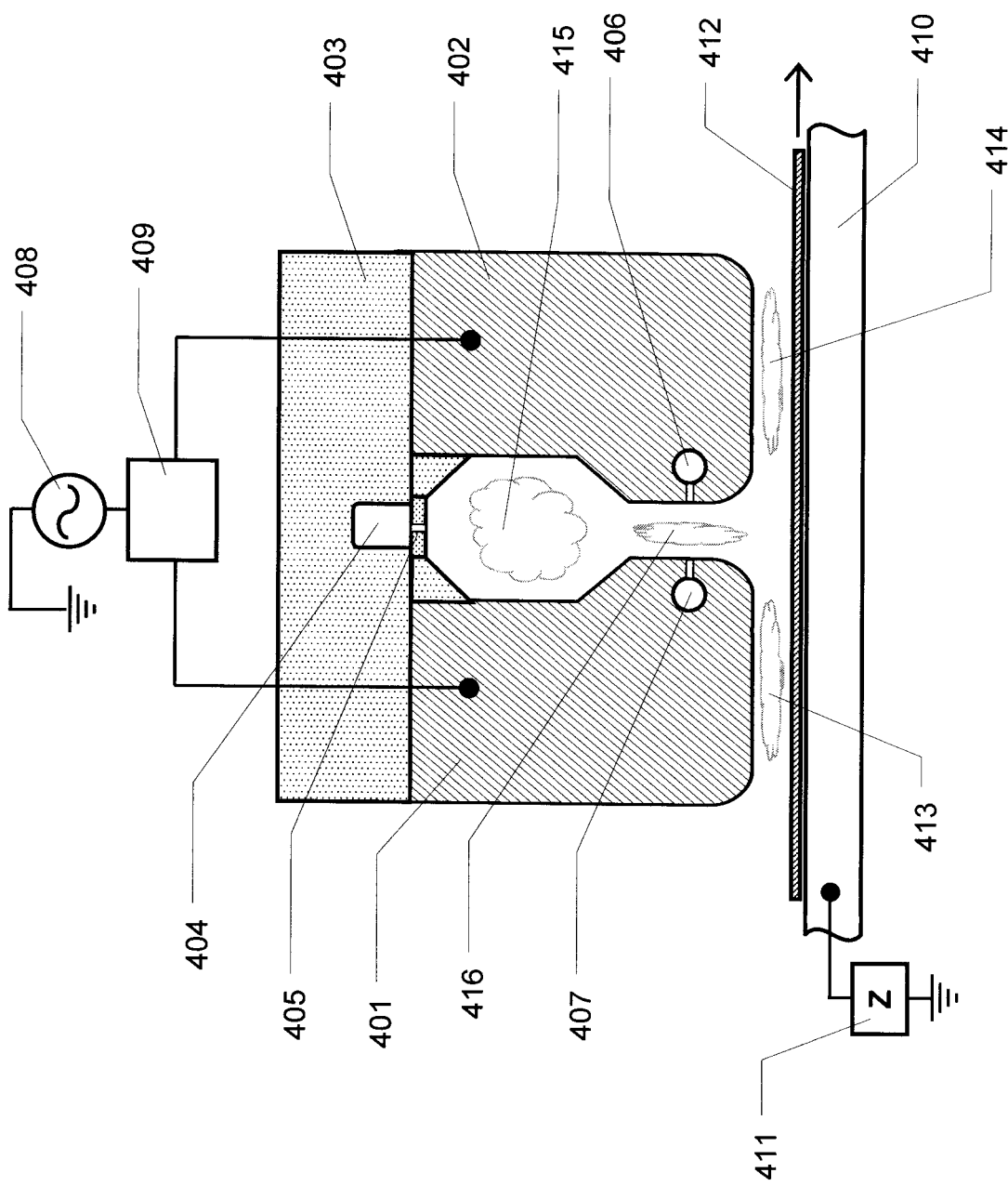
FIG. 4 depicts a diagram illustrating a narrower gap region between two electrodes in a source close to downstream injection of a second source gas can increase the plasma energy in that region and enhance the reaction of second source gas with a first source gas injected upstream of this region.

In the inventive embodiment illustrated in cross section in FIG. 4, a wider gap 415 is at the top, close to the injection point of the first source gas, and the narrower gap 416 is at the lower portion, at the injection point of the second gas. The profile transitions the gap width smoothly so as to maintain smooth gas flow without recirculation. This embodiment may be preferred when the second gas mixture requires more energy to activate and/or be broken down to react with the first source gas mixture injected above it. This embodiment of the invention also has a benefit of shortening the time and distance for reactive gas species to reach the substrate.

The overall balance between plasma energy in the gap between the electrodes and between electrodes and substrate in this invention can be controlled by varying the amount and/or phase of RF power delivered to each electrode. An embodiment utilizing a single RF power supply to power a 2 electrode PGU is shown in FIG. 5. A continuous wave RF power supply 501 is connected to a matching network 502 that matches its input impedance to the output impedance of the power supply to avoid reflected power in the connection between the two units. The output of the matching network is connected to a phase splitter 503 that generates two outputs that are connected to electrodes E1 and E2, respectively. The two powered electrodes E1 and E2 are mounted above the pedestal support structure electrode E0 that is connected directly to ground, or connected to ground via a passive impedance circuit 504.

In this embodiment, the phase splitter 503 generates two equal magnitude waveforms with the same frequency supplied by the RF power supply. A typical RF frequency f is 13.56 MHz, but depending on the application, a range from 400 kHz to 120 MHz may be used. The waveform repeats completely at a time interval equal to the inverse of the frequency f, for example, for 13.56 MHz the time period is 74 ns. Since the waveforms are continuous, a time separation of 0 and 1/f are equivalent. Therefore, the maximum separation occurs at a time equal to half the period, for 13.56 MHz equal to 37 ns. Equivalently, the time separation can be calculated as phase angle φ as shown in FIG. 5. The unit for phase angle is independent of the frequency and can be radians or degrees. The range of no waveform separation to maximum separation works out to be 0 to π in radians, or 0 to 180° in degrees.

At a zero phase angle there is no net voltage between E1 and E2 as connected in FIG. 5. Essentially E1 and E2 act as a single electrode with respect to the grounded substrate holder E0. Some plasma will be present in the gap between the electrodes, but the plasma currents flow back and forth via the grounded E0. Therefore, the plasma energy for zero phase angles will be greatest in the gap towards the substrate holder.

At a phase angle of 180° the waveforms are complete opposites of each other, when the E1 voltage is at a maximum positive value the E2 voltage is at a maximum negative value. Half a period later the voltage difference is the same, but in the opposite direction. Plasma currents now flow back and forth mostly between the two electrodes E1 and E2, creating a situation where most of the plasma energy is now greatest in the gap between the two electrodes. Some plasma current will also flow to the substrate, but the electrode gap current will dominate since voltage difference between the electrodes is double that to the grounded substrate holder.

A key feature and benefit of the invention illustrated by FIG. 5 is the ability to shift the distribution of plasma energy delivered to the substrate versus the gap between electrodes. Tuning the plasma distribution from reactant activation to substrate bombardment by varying the phase angle of the waveform delivered to E1 and E2 to intermediate values between 0 and 180° is a process control feature not available in the prior art. For example, a series of PGU's in a processing unit may operate at different phase angles. The first PGU's in the series may operate at phase angle close to 180° to first deposit a film at a high rate by breaking down reactants efficiently in the electrode gap. The following PGU's in the series may operate closer to 0° to bombard the film deposited on the substrate to make it denser. For some cases requiring a highly dense barrier films the growth can be interrupted frequently for a densification step by operating alternate PGU's at phase angles close to 180° and close to 0°. By this method dense barrier films can be deposited at substrate temperatures of 100° C., or less. With this invention dense barrier films have been deposited at 50° C.

Figure 6:
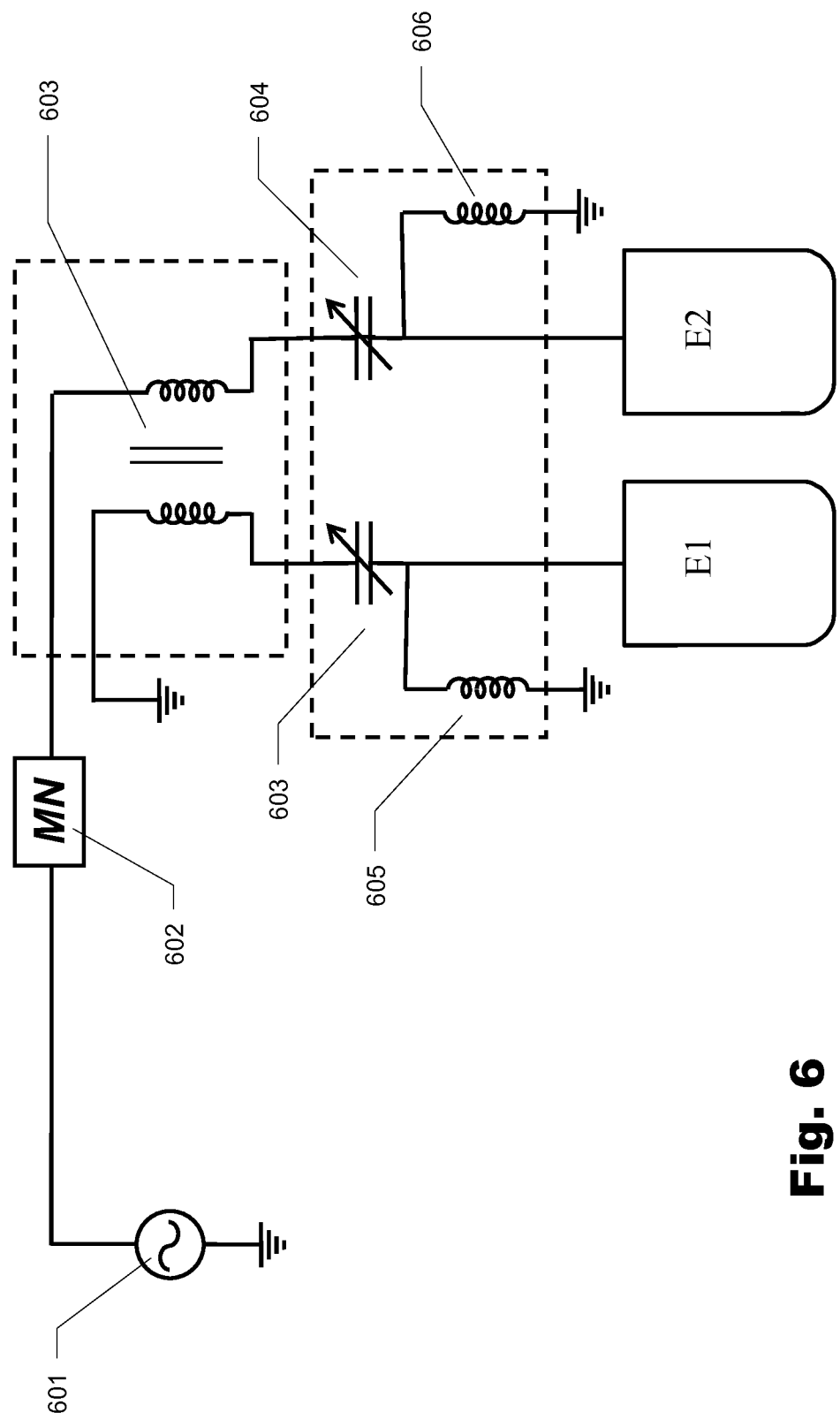
FIG. 6 depicts a diagram illustrating a practical 2-way RF splitter implementation where a Balun transformer first generates a balanced output that can be either in phase, or 180° out of phase, followed by a tunable LC network to adjust the relative phase angle of the two electrodes in the source (or PGU) between 0° and 180°.

FIG. 6 illustrates a practical 2-way RF splitter embodiment of the present invention. The RF generator 601 is connected via matching network 602 to cancel any reflected power back to the RF power supply. The output from the matching network is connected to a Balun transformer 603 that converts the single input to two outputs that are balanced to carry equal current. The Balun outputs can be either in phase, or 180° out of phase, depending on the direction the coils are wound and connected. Each output is followed by a tunable LC network; each consisting of a tunable capacitor 603 and 604 connected to an inductor 605 and 606, respectively. By adjusting the variable capacitors 603 and 604 current from the electrodes can be shunted to ground via the inductors 605 and 606, creating a change in the phase of the waveform at each electrode. If the Balun outputs are wired to be in phase it is feasible with this circuit to adjust the relative phase between the two electrodes in a range of 0° to 60°. If the Balun outputs are wired to be 180° out of phase it is feasible with this circuit to adjust the relative phase between the two electrodes in a range of 120° to 180°. Operation close to 90° is more sensitive to changes in plasma impedance and may require a different configuration than shown FIG. 6.

Figure 7:
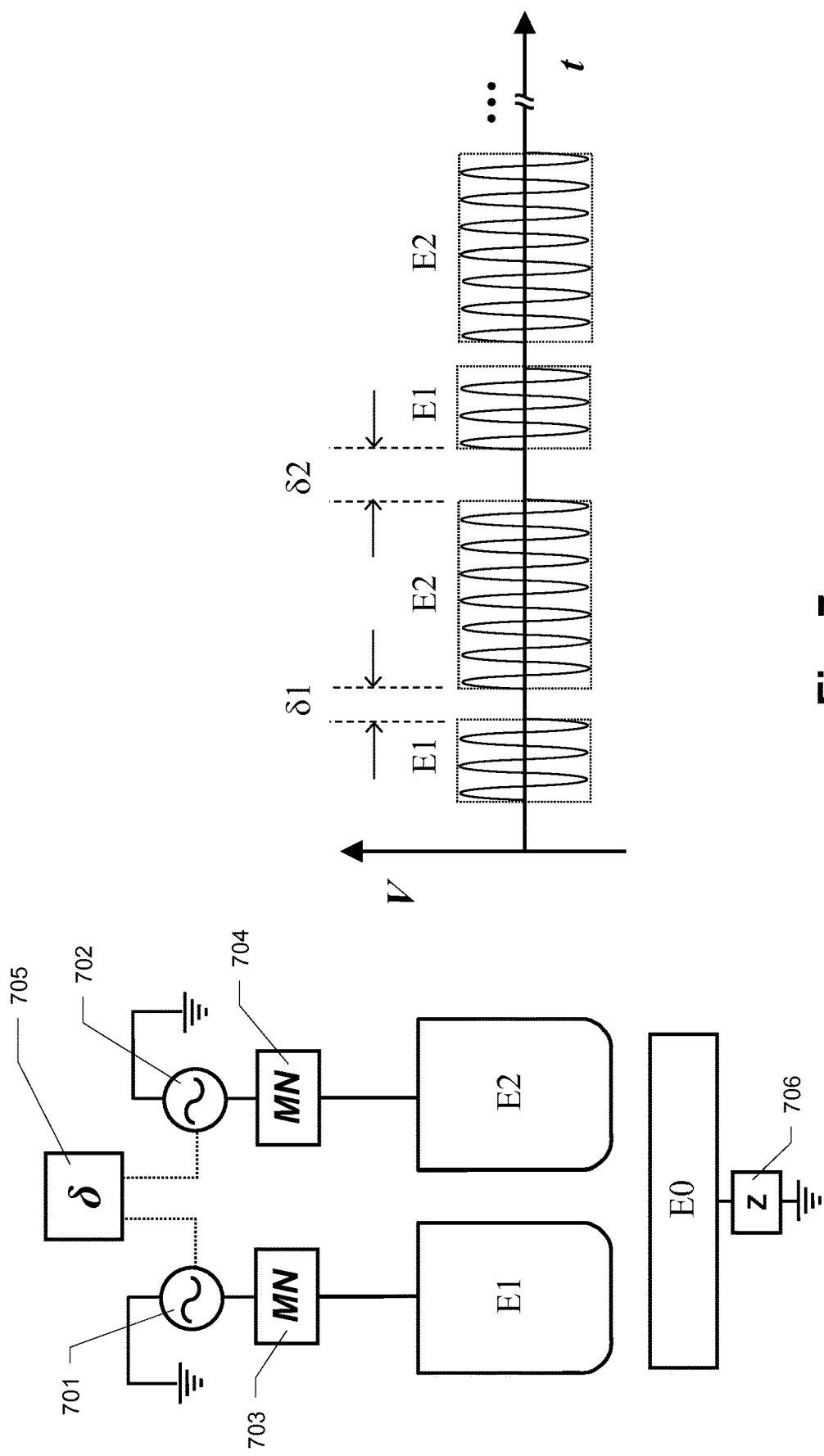
FIG. 7 depicts a diagram illustrating the use of two RF power supplies each connected to an electrode in a two electrode source. The RF supplies are controlled by a timing controller that is programmed to repeatedly turn each RF supply on and off at short intervals independently.

An alternative implementation is to use individual power supplies for each electrode. An embodiment utilizing two power supplies is shown in FIG. 7. Electrode E1 is connected to RF power supply 701 via matching network 703 and electrode E1 is connected to RF power supply 702 via matching network 704. Each RF supply connection requires a matching network to cancel out the reflected power that can otherwise damage the RF supply. However, the presence of two parallel matching networks prevents continuous mode operation. Because the plasma couples the two electrodes together one matching network will take control and prevent the other matching network from matching its impedance and cause that RF power supply to shut down from excessive reflected power. Pulsing mode operation is possible by using a programmable sequencer 705 that via a control input connection can turn on and off the RF power supply outputs independently. RF power supplies that are enabled for pulsing can rapidly switch of their output and connected it to ground based on the input of a controls signal connection. The required time scale for pulsing is in the range of 500 µs to 500 ms. At this timescale the plasma can respond, but the matching network is too slow to respond. Therefore, stable operation from the perspective of power delivery can be accomplished, while the plasma distribution can be tuned to affect the desired process results.

The programmable parameters are the lengths of time each RF supply is turned on and off, and the synchronizing time interval between the two supplies. An example of a pulse sequence is shown in FIG. 7. The sequence illustrates that E1 and E2 can receive RF power for different lengths of time and be grounded for different lengths of time. The off and on times are typically in the millisecond range. If the pulses do not overlap, or even have some off time between them as shown, then plasma intensity will be mostly in the gap between E1 and E2 to favor activation the source gas mixture. If the pulses have some overlap with both E1 and E2 receiving power, then plasma intensity can be shifted towards E0 to enhance substrate processes.

Figure 8A:
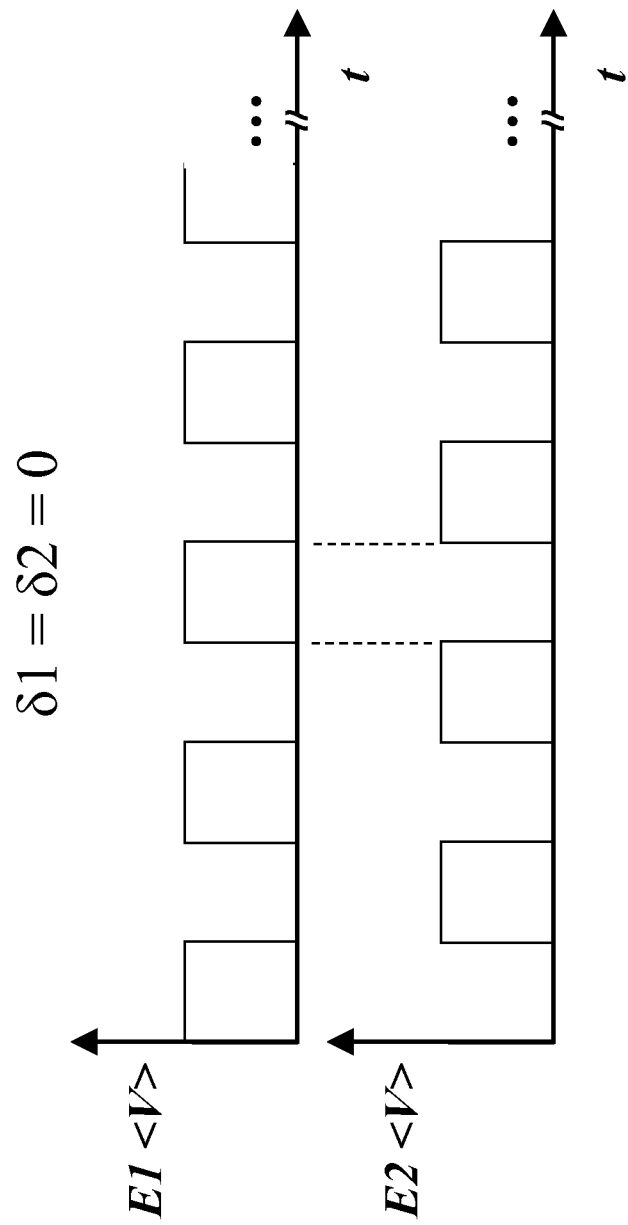
FIG. 8(A) depicts a timing diagram illustrating the case when the RF pulses sent to two electrodes in a source line up without an overlap, or delay.
Figure 8C:
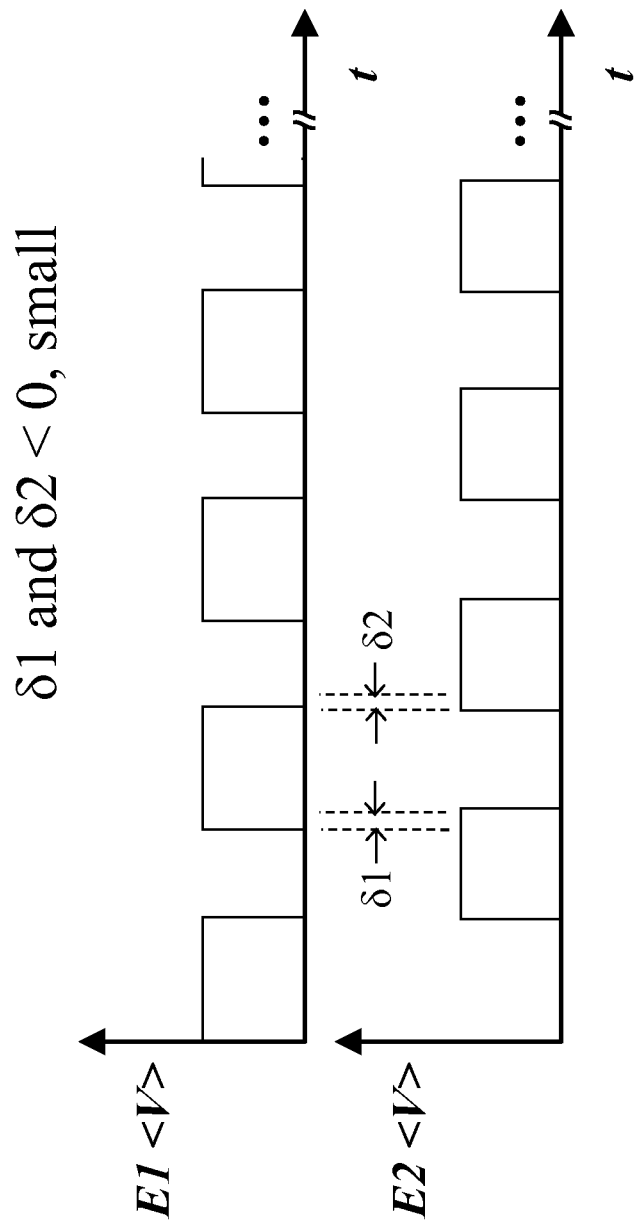
FIG. 8(C) depicts a timing diagram illustrating the case when the RF pulses sent to two electrodes in a source has an overlap, during the overlap both electrodes are receiving RF power.
Figure 8D:
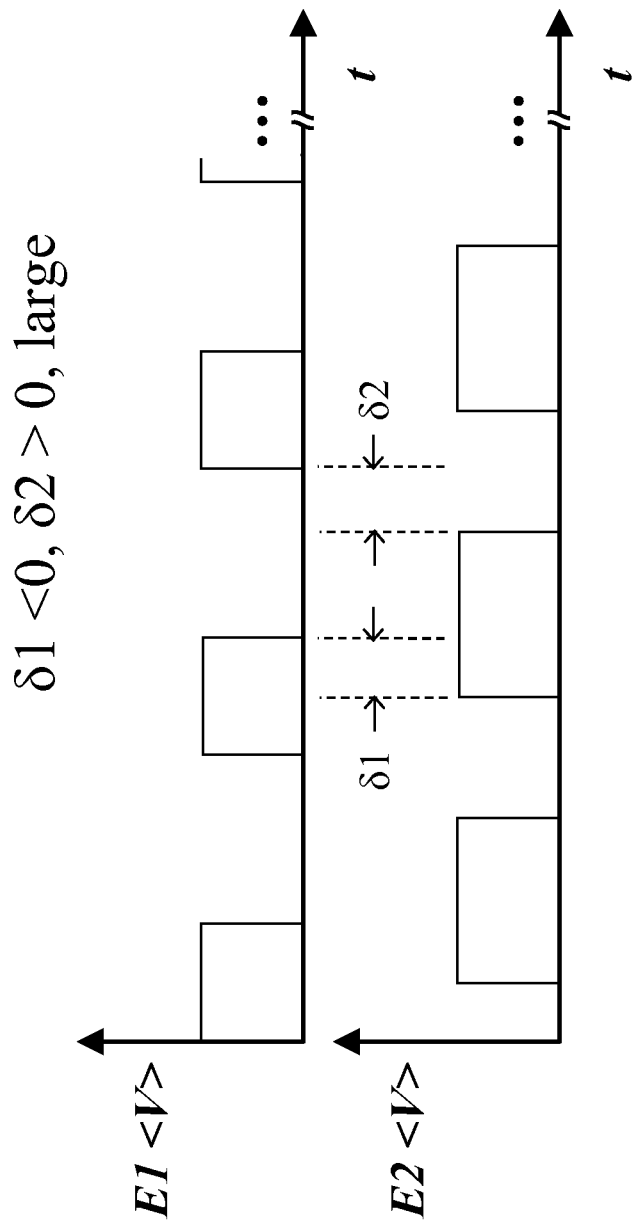
FIG. 8(D) depicts a timing diagram illustrating the case when the RF pulses sent to two electrodes in a source has an overlap and a delay, during the overlap both electrodes are receiving RF power and during the delay neither electrode is receiving RF power.

FIGS. 8A-8D illustrate examples of pulsing sequences that can be used in some embodiments of the invention. FIG. 8(A) illustrates a pulsing sequence with equal length RF on pulses delivered alternatively to E1 and E2 with zero overlap or delay. This embodiment would concentrate plasma strongly in the gap to activate the precursor gas mixture injected between E1 and E2. FIG. 8(B) illustrates a case of equal length RF on pulses delivered to E1 and E2 with a delay between pulses when both electrodes are grounded. This embodiment concentrates plasma between E1 and E2 to activate precursor gas with the additional benefit while both E1 and E2 are grounded allowing neutral active gas species to flow towards the substrate to enhance substrate processes. FIG. 8(C) illustrates a case of equal length RF on pulses delivered to E1 and E2 with a negative delay between pulses when both electrodes are RF powered. This embodiment allows for plasma between E1 and E2 to activate precursor gas with the additional benefit while both E1 and E2 are powered to move ions in the plasma towards the substrate to enhance substrate processes. FIG. 8(D) illustrates a case of non-equal length RF on pulses delivered to E1 and E2 with a negative delay between E1 to E2 pulses when both electrodes are RF powered and a positive delay between E2 to E1 pulses when both electrodes are grounded. This embodiment allows for plasma between E1 and E2 to activate precursor gas with the additional benefit while both E1 and E2 are powered to move charged molecules in the plasma towards the substrate to enhance substrate processes and while both E1 and E2 are grounded to allow neutral active gas species to flow towards the substrate to enhance substrate processes. This embodiment also demonstrates that by lengthening the pulse for E2, the electrode that the substrate reaches second in the left to right movement direction, it is possible to add additional treatment of the substrate with ions to enhance substrate processing accomplished previously while the substrate moved under the gap between E1 and E2.

Figure 9A:
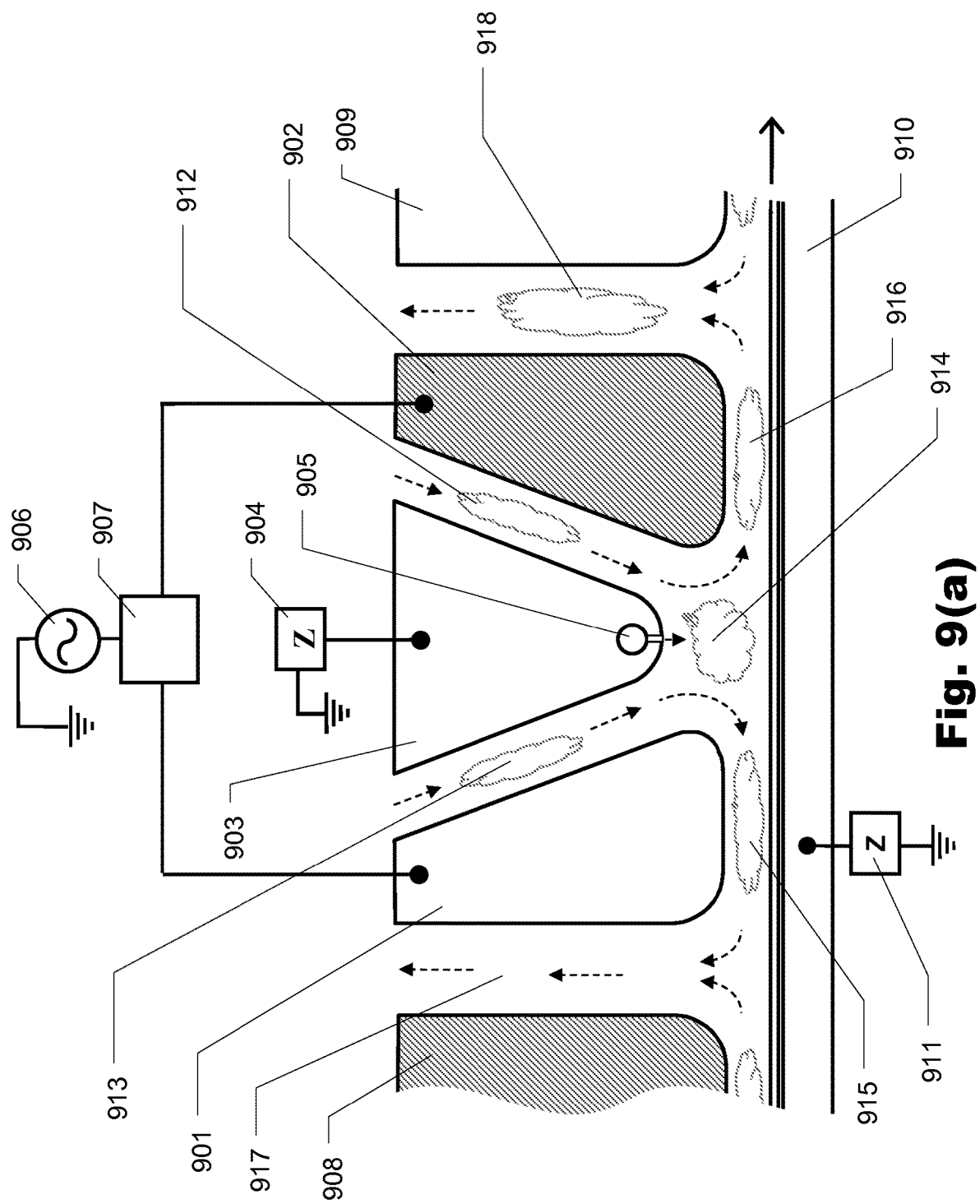
FIG. 9(A) depicts a diagram illustrating in cross-section an exemplary configuration of a three electrode source consisting of an un-powered electrode inserted between two powered electrodes. The combination of electrode shapes, RF connection, and gas injection locations create multiple plasma regions for dissociation, deposition, film treatment, and particle control.

Some embodiments of the invention further balance precursor activation and substrate processing by the physical configuration of the electrodes in a PGU. FIG. 9(A) illustrates in cross-section an embodiment of the invention where a passive electrode 903 is inserted between a pair of RF powered electrodes 901 and 902. The passive electrode 903 is grounded, directly or via an impedance circuit 904. Powered electrodes 901 and 902 can be connected to a single power supply 906 via a power split circuit 907 as shown. It is also possible in some embodiments to use to individual RF supplies since in this configuration most of the RF currents flow to ground and not between electrodes.

The relative plasma intensity to favor precursor activation of the first gas mixture injected at the top gap 912 and 913 can be enhanced or reduced by making gaps 912 and 913 smaller or larger. The gaps 914, 915, and 916 can similarly be made smaller or larger to increase or decrease plasma intensity in these regions. The exemplary embodiment shown in FIG. 9(A) has a larger gap in region 914 below the non-powered electrode 903 to reduce plasma intensity to reduce premature gas precursor reaction. The smaller gaps in regions 915 and 916 provides for more plasma intensity to provide more energy to enhance the substrate processes in these regions. This embodiment has an additional benefit of providing an ability to inject a second gas mixture from a manifold 905 in the passive electrode 903 reducing the need for RF isolating gas feed connections and risk of plasma forming inside injection manifold. An additional feature of this embodiment is that exhaust gas manifold can have more or less intense plasma in the exhaust regions 917 and 918, depending on the phase difference to the electrodes 908 and 909 of the adjacent PGU. Both cases are shown in the exemplary illustration represented by FIG. 9(A). Electrodes 901 and 908 are powered in phase with small amount to no plasma in gap 917. Electrodes 902 and 909 are powered out of phase creating more intense plasma in the exhaust region gap 918. Some processes may benefit from suppressing plasma in the exhaust region to reduce possibility of unwanted plasma in the exhaust manifold. Some processes may benefit from plasma in the exhaust region to reduce gas phase particles by forming stable deposits on the electrodes. Illustrated in the embodiment shown in FIG. 9(A) is also that gap 914 can have more influence from the two powered electrodes 901 and 902 by using an angled cross-section.

Figure 9B:
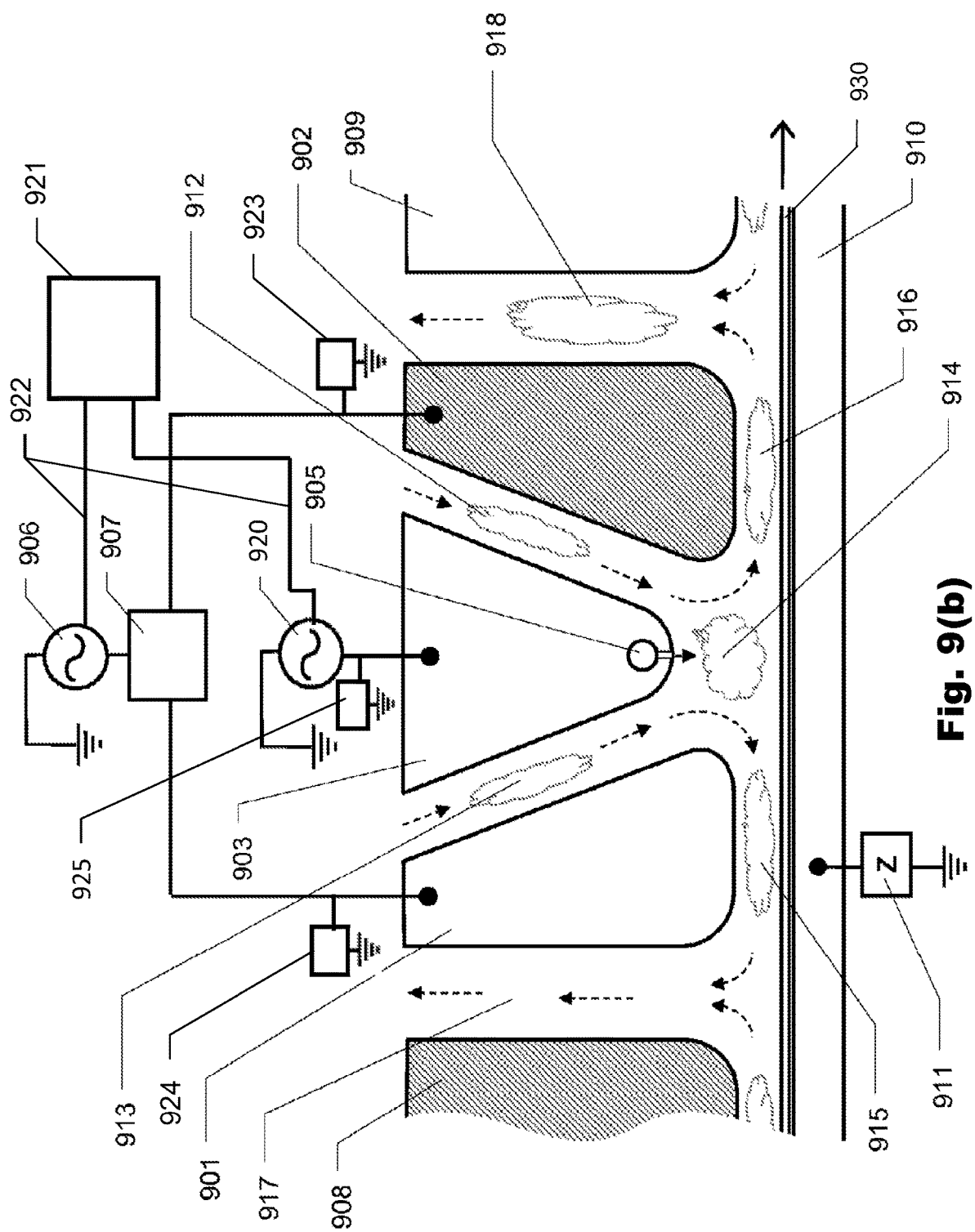
FIG. 9(B) depicts a diagram illustrating in cross-section an exemplary configuration of a three electrode source including an electrode powered at a higher RF frequency, which also contains a gas manifold for a second gas, that is inserted between two other electrodes powered at lower RF frequencies. The combination of electrode shapes, RF connection, and gas injection locations create independently controllable plasma regions for dissociation of the first gas, and other independently controllable plasma regions for deposition and film treatment.

Additional embodiments of the invention, as seen in FIG. 9(B), further provide for manual and/or automatic programmable control of RF power to the plasmas by means of controller 921 which is communicatively coupled to RF power supplies 906 and 920 via control cables 922. Controller 921 may include a processor and a memory storing instructions that, when executed by the processor, cause controller 921 to perform the operations of controller 921 described herein. The quality of a plasma that is varied by controlling the RF power input is the power density, which is equivalent to the "intensity" of the plasma (mentioned in various paragraphs of the specification). The power density is generally the electric power flowing to that plasma divided by the surface area of the side of the electrode that is adjacent to that plasma (i.e., the electrode which supplies power to that plasma).

RF power supply 920 supplies power predominantly (>90%) and in some embodiments very predominantly (>95%) to the plasma in the gap 913 between electrodes 901 and 903 and the plasma in the gap 912 between electrodes 902 and 903. Further, in some embodiments the RF power supply 920 may incorporate a filter that passes currents at the drive frequency of the RF generator which creates the RF currents of RF power supply 920, while blocking currents of other RF frequencies, and in particular, the frequency of RF power supply 906.

RF power supply 906 supplies power to the plasma in the gap 915 between electrode 901 and the substrate 930 and the plasma in the gap 916 between electrode 902 and the substrate 930. FIG. 9(B) illustrates in cross-section embodiments of the invention where an RF power supply 920, which in some embodiments has a frequency greater than or equal to 13.56 MHz, is connected to electrode 903. Said electrode 903 is positioned between a pair of electrodes 901 and 902 that are connected to at least one RF power supply 906, having an RF frequency that is less than that of power supply 920, and in some embodiments is less than or equal to 13.56 MHz.

Further, frequency selective grounding impedances, 923 and 924, are connected to electrodes 902 and 901, respectively. Such impedances typically comprise reactive components such as capacitors and inductors. In some embodiments, reactive impedances 923 and 924 may be resonant filters whose impedance at the frequency of RF power supply 920 is very low—in preferred embodiments less than 10 Ohms—but whose impedance at the frequency of RF power supply 906 is high, such as above 100 Ohms and preferably very high such as above 1000 Ohms. These RF frequency dependent impedances cause electrodes 901 and 902 to have a very low voltage amplitude (e.g., less than 15 Volts RMS) at the frequency of RF power supply 920, while sustaining a high voltage amplitude (e.g., greater than 50 Volts RMS) at the frequency of RF power supply 906. If not already apparent, RMS is an abbreviation for root mean square.

Further, impedance 925 is a frequency-dependent impedance which may be preferably composed of reactive elements whose total impedance is high to very high, preferably more than 100 Ohms and preferably more than 1000 Ohms, at the frequency of RF power supply 906, and also is high, such as more than 100 Ohms, and preferably more than 1000 Ohms at the frequency of RF power supply 920. Impedance 925 causes the RF voltage on electrode 903 to be small—typically less than about 20 Volts RMS—at the frequency of RF power supply 906, while the RF voltage on electrode 903 may be large—typically more than 30 Volts RMS—at the frequency of RF power supply 920. A result of the frequency selective grounding impedances 923, 924 and 925 is that RF power supply 920 may be used to control a power density of the plasmas in gaps 912 and 913 (independently of the power supplied by RF power supply 906), and RF power supply 906 may be used to control a power density of the plasmas in gaps 915 and 916 (independently of the power supplied by RF power supply 920). Stated differently, RF power supply 920 may be thought of as the control for tuning the power density of the plasmas in gaps 912 and 913, and RF power supply 906 may be thought of as the control for tuning the power density of the plasmas in gaps 915 and 916.

Another consequence of the selective impedances (and the electrode geometries) is that power from RF power supply 906 is predominantly supplied to gaps 915 and 916. In one embodiment, at least 90% of the power from power supply 906 is supplied to the plasmas in gaps 915 and 916. More preferably at least 95% of the power from power supply 906 is supplied to the plasmas in gaps 915 and 916, and even more preferably, at least 99% of the power from power supply 906 is supplied to the plasmas in gaps 915 and 916. Another consequence of the selective grounding impedances (and the electrode geometries) is that power from RF power supply 920 is predominantly supplied to gaps 912 and 913. In one embodiment, at least 90% of the power from power supply 920 is supplied to the plasmas in gaps 912 and 913. More preferably at least 95% of the power from power supply 920 is supplied to the plasmas in gaps 912 and 913, and even more preferably, at least 99% of the power from power supply 920 is supplied to the plasmas in gaps 912 and 913. In particular, the power supplied to the plasmas in gaps 912 and 913 provides for a number of collision processes in the plasmas, which in some embodiments comprise collision processes, resulting in production of excited states of some atoms and molecules, that may result in dissociation of some excited molecules.

The bottom of electrode 903 is located above the plasma in gap 914 and the minimum distance from the electrode 903 to the pedestal 910 is at least twice the distance from electrodes 901 and 902 to the pedestal 910. The distance from electrodes 901 and 902 to the substrate is in some embodiments greater than about 5 mm and less than the minimum width of the electrodes 901 or 902. The elevated position of the bottom of electrode 903 above the bottoms of electrodes 901 and 902 creates a volume 914 for gas mixing and for containing a plasma which is adequate for reaction of (i) species from the activated first gas and (ii) the second gas to produce the desired species for depositing the thin film or treating the surface of the substrate. Within electrode 903 is a gas manifold 905 having a plurality of channels (only one visible in cross section drawing of FIG. 9(B)) that conduct the second gas into the gap between electrodes 901 and 902 and below electrode 903. The channels each have a width less than 1 mm, and preferably less than 0.5 mm. The very narrow channels prevent plasma from flowing up into the channels and forming a hollow cathode discharge that would otherwise break down the second gas within the channel, causing deposition of undesirable material within the channel and loss of the expensive second gas. Because the channels are too narrow to support hollow cathode plasmas, the second gas, that has not been broken down, conducts down the narrow channels leading to the converging streams of the activated first gas within plasma 914. The minimum distance between electrodes 901 and 902, is greater than the sum of the respective widths of gaps 912 and 913 so there is adequate volume for reactions approaching completeness of the activated first gas and the second gas. This greater width of the gap 914 between electrodes 901 and 902 further greatly reduces the rate of deposition of film on electrodes 901 and 902 because the points of electrodes 901 and 902 that are closest to the plasma in gap 914 are more distant from the plasma in gap 914 (as compared to a configuration with a smaller width of gap 914) where the flows of first and second gases converge and react chemically. Therefore, a larger fraction, typically greater than 50% of the depositing species is used to form the film on substrate 930, increasing the cost-efficiency of the process.

The plasmas in the gap 913 between electrodes 901 and 903, and the plasma in the gap 912 between electrodes 902 and 903 are sustained principally by the power supply 920 to provide precursor activation of the first gas such that increase of the RF power to these gaps increases the rate of production of neutral radicals that then flow into the gap 914 between electrodes 901 and 902. In gap 914, a reaction occurs between the activated atoms and molecules of the first gas and the second gas injected from manifold 905. The plasmas in gaps 915 and 916 adjacent the substrate 930 are sustained by RF power from supply 906 and accelerate ions from these two plasmas to the substrate surface. The levels of RF power from RF sources 906 and 920 may be independently controlled by programmable controller 921 to provide plasmas whose intensities can be separately varied to provide the required process performance. In some embodiments, the RF power level across the second and third gaps (913, 912) may be greater than that across the first gap (915, 916) and the fourth gap 914, for all or part of the duration of a deposition process to provide substantial dissociation of molecular gases such as nitrogen, ammonia, oxygen, nitrous oxide or other molecular gases in the plasmas within gaps 912 and 913, before they mix with the second gas—which in some embodiments may be a silane or metal containing precursor—within the plasma in the fourth gap 914 between electrodes 901 and 902. In alternative embodiments, programmable controller 921 may be used to adjust the RF power level across the second and third gaps (913, 912) to be less than that across the first gap (915, 916), because the process requires a greater power density of ion bombardment for growing a film.

As shown in FIG. 9(B), the corners of electrodes 901, 902 and 903 adjacent to the substrate have a rounded profile to ensure a smooth gas flow around the respective electrodes without gas flowing in recirculation loops. This also has the effect of reducing electric field enhancement at the corners that may create undesirable intense local plasma regions. In some inventive embodiments, cross sectional profiles of the rounded corners are arcuate, with curvature radii in the range between about 3 mm and 20 mm and/or between a quarter of the width to a full width of any one of the gaps 912-916.

Figure 10:
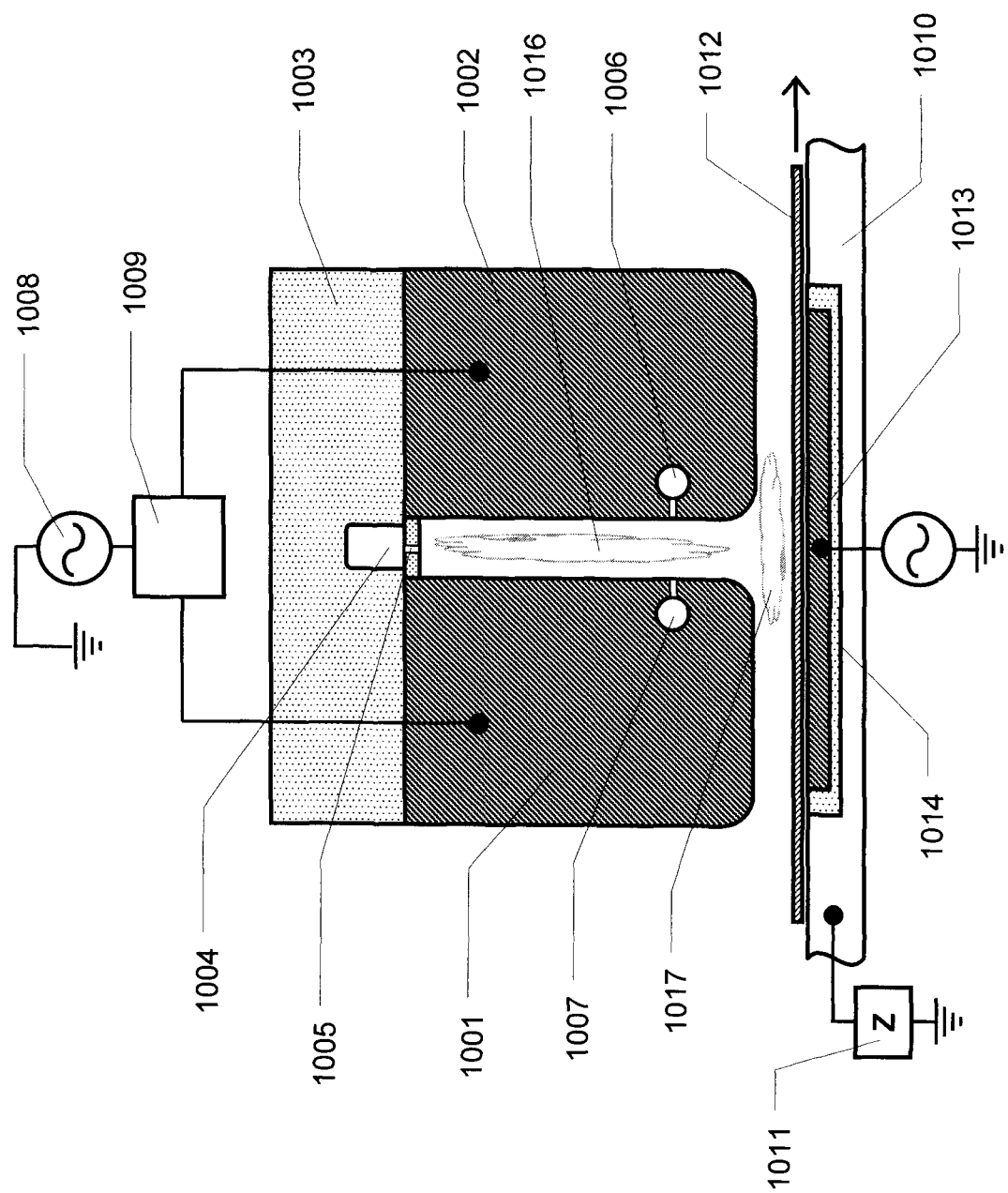
FIG. 10 depicts a diagram illustrating in cross-section an exemplary configuration of a three electrode source consisting of a powered lower electrode underneath the substrate and opposite two symmetrical powered electrodes. The lower electrode is located opposite to the region that includes the gap between the two symmetrical electrodes. The bias electrode may be sized to expose considerably less area towards the plasma compared to the other two electrodes.

FIG. 10 illustrates in cross-section an embodiment of the invention where opposite the gap between the powered electrodes 1001 and 1002 and on the opposite side of the substrate is situated a lower electrode 1013. This can provide a region on the substrate where the growing film is exposed to intense bombardment by ions from the plasma 1017 to provide activation energy for forming high quality films at commercially competitive deposition rates. An example is the deposition of dense barrier films that need added energy to become denser with fewer unwanted components such as such hydrogen-containing compounds as OH or NH. As the deposition rate is increased the amount of ion bombardment power must increase in proportion to provide high quality films. The substrate 1012 is adjacent to and above the powered electrode 1013, which is mounted in the grounded pedestal support 1010 using a insulating partial enclosure 1014. This insulating support ensures that plasma currents from the lower electrode flows predominantly to the other powered electrodes through the plasma and not so much to the grounded pedestal through the insulator. A key feature is the smaller area exposed to the plasma by electrode 1013 compared to areas of upper electrodes 1001 and 1002. The sheath potential and electric field between the electrode surface and the plasma is dependent on the area ratio of electrodes as has been reported by many researchers on plasma processing. The surface area of the electrode 1013 adjacent the substrate is deliberately kept small—in some embodiments less than four times the width of the gap between upper electrodes. This ensures that most of the power of ion bombardment goes to the substrate surface being coated at the highest rate—that area just underneath the gap between electrodes in FIG. 10. In some embodiments the power supplied to the lower electrode will be at a different excitation frequency or combination of frequencies than the ac power supplied to the upper two electrodes. In this case it is essential to greatly reduce the cross-talk between the two impedance matching networks for the two different electrode sets. This may in some embodiments be accomplished by using simple passive filters that prevent the power from either generator/match network combination from going backwards into the other matching network. Such a simple filter circuit is shown in FIG. 11.

Gas injection into the source in FIG. 10 may in some embodiments be similar to that in FIG. 2, where reactant gas from reservoir 1004 that is injected through holes or slots 1005 flows down between the upper electrodes and is activated in the plasma 1016. At some point downstream from the point of injection the precursor is injected from manifolds 1006 and 1007 so it mixes and reacts with the gas flowing down toward the substrate. The reaction products then can deposit on the substrate 1012 where they are ion bombarded in proportion to the RF or VHF power fed to electrode 1013.

Figure 11:
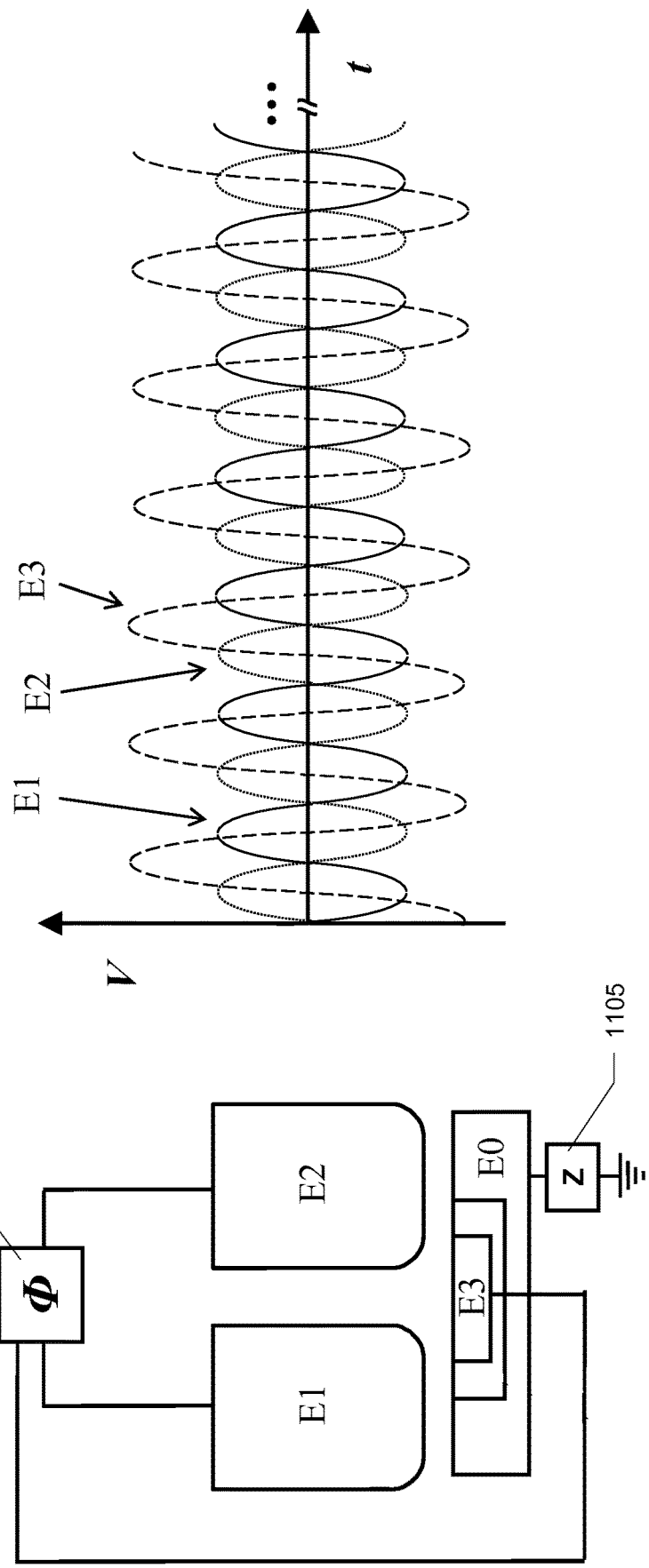
FIG. 11 depicts a diagram illustrating the use of a 3-way phase splitter to power a 3 electrode source with a single RF supply. The two symmetrical driven electrodes are 180° out of phase and the phase of the bias electrode RF phase is ±90° out of phase, respectively, to each of the voltage waveforms supplied to the symmetrical electrodes.

FIG. 11 shows some embodiments of the RF or VHF power feed to the electrodes. There is a single power supply whose output is matched by a network 1102 to the combined impedance of all the electrodes and including connecting circuitry. The splitter 1103 provides power to electrodes E1 and E2 symmetrically that may be 180° out of phase to upper electrodes while providing power E3 that is 90° out of phase relative to both E1 and E2 and has greater voltage. The pedestal E0 is grounded through a small impedance 1105 that may be less than 10 Ohms including both resistive and reactive components.

Figure 12:
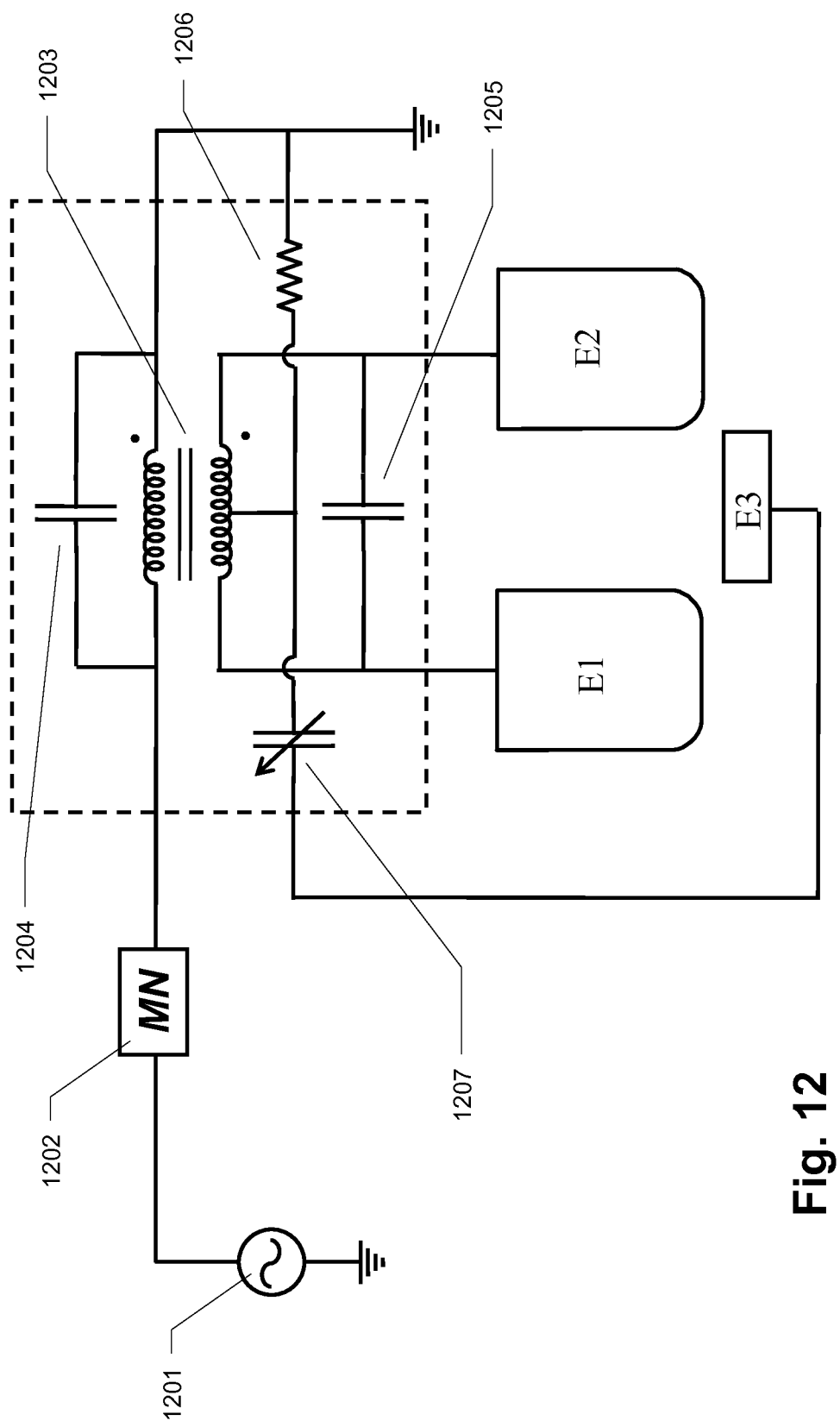
FIG. 12 depicts a diagram illustrating a practical 3-way RF splitter implementation where an LC Balun transformer supplies the two symmetrical electrodes with RF waveforms that are ±90° out of phase with respect to the power supply waveform. The RF waveform for the bias electrode is derived from a ground referenced center tap on the secondary coil via a tunable capacitor.

FIG. 12 shows an embodiment of the splitter that provides power from a single supply 1201 and matching network 1202 at a single RF or VHF frequency to all three electrodes. In some embodiments there is a transformer 1203 that has a shunt capacitor 1204. There is a center tap 1205 for the secondary of said transformer that is connected through variable capacitor 1207 to the lower electrode E3. The two opposite phase ends of the secondary go to the upper electrodes E1 and E2. The shown circuit provides power to the upper electrodes that is approximately 180° out of phase while that to the lower electrode is 90° out of phase with either upper electrode.

Figure 13:
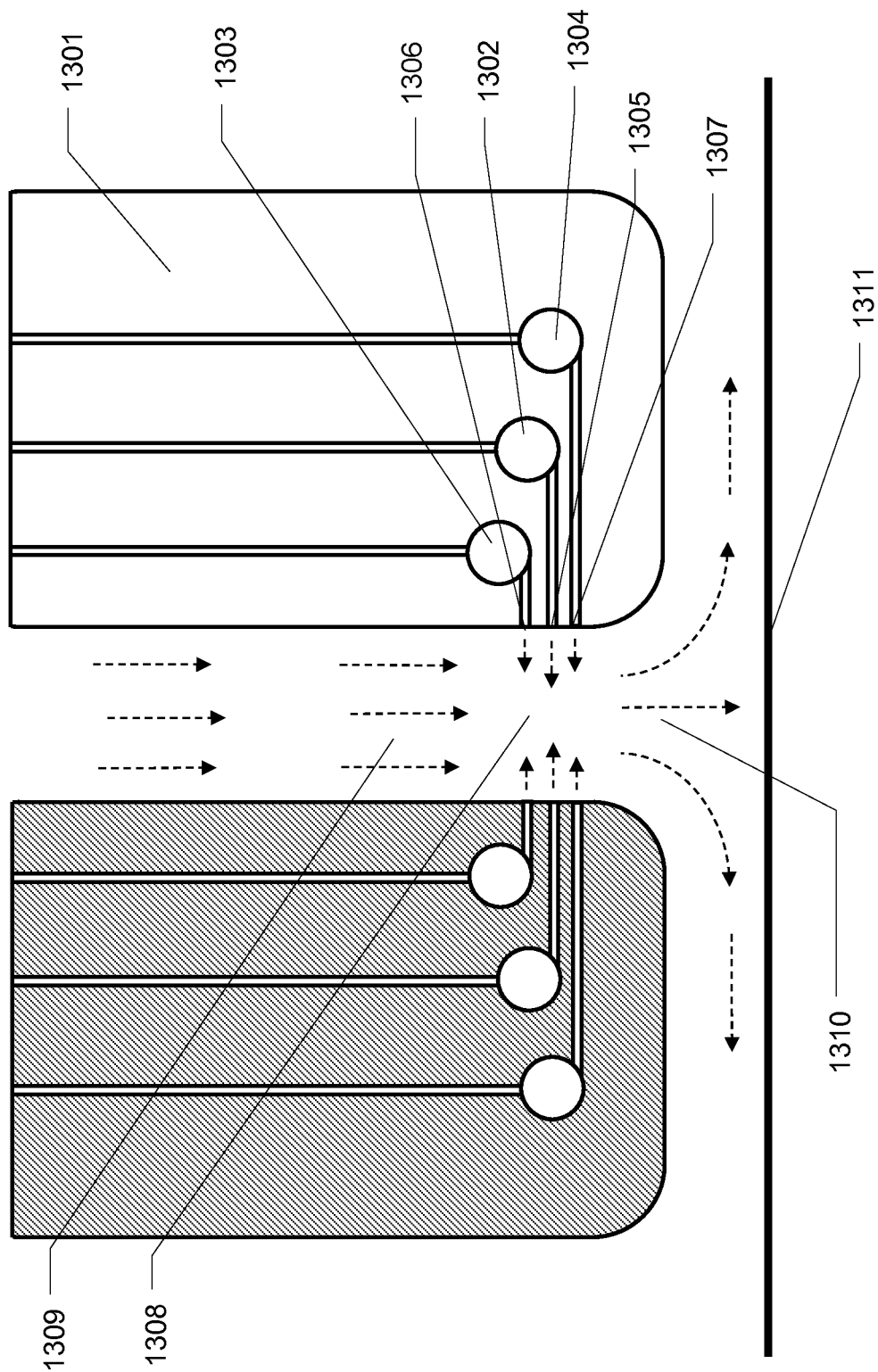
FIG. 13 depicts a diagram illustrating the implementation of guard flow in an exemplary cross-section of a two electrode source. The guard flow next to an injection point of reactant reduces the tendency for gas-phase reactions to occur on surfaces next to the reactant injection point.

FIG. 13 shows a gas injector configuration that may be used in some embodiments for providing precursor gas to the plasma while reducing deposition of material on the electrodes, particularly in the area near the injection holes or slots. Electrode 1301 has a principal reservoir or manifold 1302 for injection of the precursor gas through injector holes or slots 1305 into the volume 1308 where it mixes and reacts with the gas stream 1309 to form species that will make up the coating on the substrate. To substantially reduce reactive species from the stream 1309 from mixing and reacting with the injected precursor from 1305, the reservoirs 1303 and 1304 may be used to provide gas through holes or slots 1306 and 1307 respectively that may include inert gas or a de-activating gas or both. A deactivating gas is one that reacts with and de-activates one or more reactive species in the gas stream with the effect of reducing its reaction rate with the precursor. This especially reduces the rate of deposition of films near the injector holes where the concentration of de-activating gas is highest. In one example embodiment where the active species include oxygen excited molecules and oxygen atoms one de-activating gas is hydrogen and another is nitrogen. The hydrogen reacts with the excited oxygen species to produce water vapor which is less reactive with precursors such as silane or HMDSO. Nitrogen molecules can transfer energy from meta-stable oxygen to make the oxygen less reactive.

The flow of such de-excitation gases should be a fraction of the flow of the reactant so that it does not greatly diminish the reaction rate of the precursor in the middle of the flow channel in which the reactant flows 1309. In some embodiments of the invention the total reactant flow 1309 may be in the range between 10 standard cc per minute and 5000 standard cc per minute for each meter of source length. In some embodiments the flow may be in the range between 100 standard cc per minute and 1000 standard cc per minute per meter of source length. Typical precursor flow rate is less than this and in some embodiments this gas is mixed with an inert diluent before flowing to the reservoirs 1302 so that per meter of source length (including both electrodes) the total flow may be in the range of 10 standard cc per minute and 5000 standard cc and preferably in the range between 10 standard cc per minute and 1000 standard cc per minute. Of this total flow the actual precursor gas component may be between 1 standard cc per minute and 100 standard cc per minute per meter of source length from nozzles 1305 in both electrodes on both sides of the gas stream. In some embodiments the de-activating gas may be introduced to the plasma from nozzles 1306 and 1307 (and as with the precursor, from the opposing electrode as well) in a mixture with an inert gas where the total flow is between 10 standard cc per minute and 1000 standard cc per minute and in preferred embodiments between 10 standard cc and 500 standard cc per minute per meter of source length. Of this total the actual de-activating gas may be less than 20% of the total and in preferred embodiments less than 10% of the total flow. In some embodiments the maximum flow of the deactivating gas may be less than 50% of the flow of the precursor and less than 25% of the flow of the reactant so that the total reaction rate of precursor with reactant is not greatly diminished. Typically flows of the de-activating gas are used to significantly reduce reactive species concentration in small regions—immediately surrounding the precursor injection nozzles, reducing reaction rates with the precursor there, and delaying the highest rates of reaction of the precursor with reactants until such precursor is closer to the middle of the channel between electrodes. The flow of reacted precursor in the stream 1310 should then be minimally diminished by the use of the deactivating gas. In some embodiments there may be no deactivating gas but only inert gas supplied to manifolds 1303 and 1304 which serves to dilute the precursor in regions immediately surrounding nozzles 1305 and 1306 and thereby reduces the reaction rate of the precursor with reactant in the region immediately surrounding the precursor injector nozzle.

Figure 14:
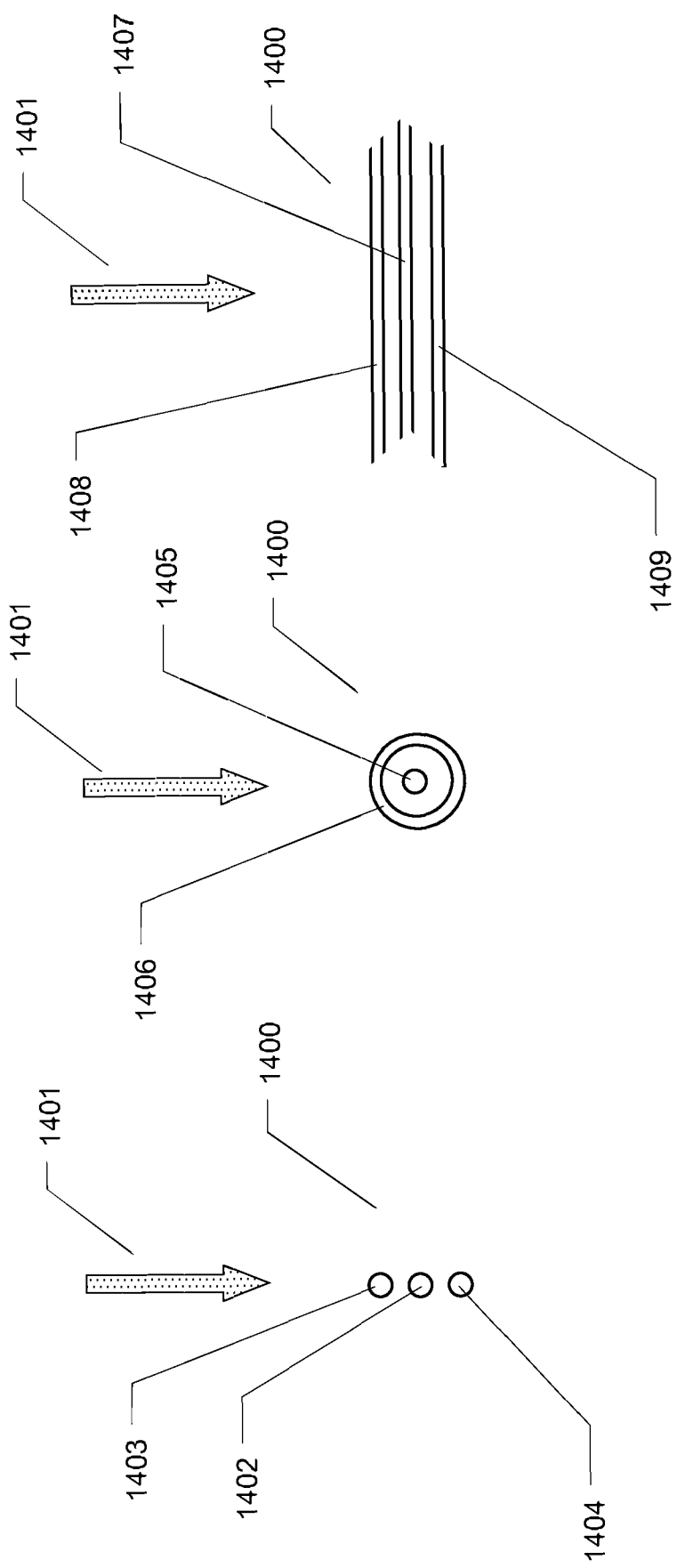
FIG. 14(A) depicts a diagram illustrating an exemplary implementation of guard flow injection using individual points above and below the reactant injection point.
FIG. 14(B) depicts a diagram illustrating an exemplary implementation of guard flow injection using a circumferential injection port to surround the reactant injection point.
FIG. 14(C) depicts a diagram illustrating an exemplary implementation of guard flow injection using linear slots above and below a reactant injection slot.

In FIGS. 14A-14C, three alternative embodiments of the injection nozzle system are shown. FIG. 14(A) shows the surface of the electrode 1400 with precursor inject nozzle being a hole 1402 and nozzles for inert and deactivating gas 1403 and 1404 also being holes that are above and below the precursor nozzle with respect to the direction of reactant gas flow 1401. In FIG. 14(B), a precursor nozzle is shown being a hole 1405 while the nozzle 1406 for the inert gas/deactivating gas is an annular opening surrounding the hole 1405 so that the dilution or deactivation region surrounds the area of precursor injection. In FIG. 14(C), a linear precursor injector shown as 1407 has linear injectors 1408, 1409 for inert gas and/or deactivating gas above and below linear precursor injector 1407, relative to the direction of reactant flow 1401.

Figure 15:
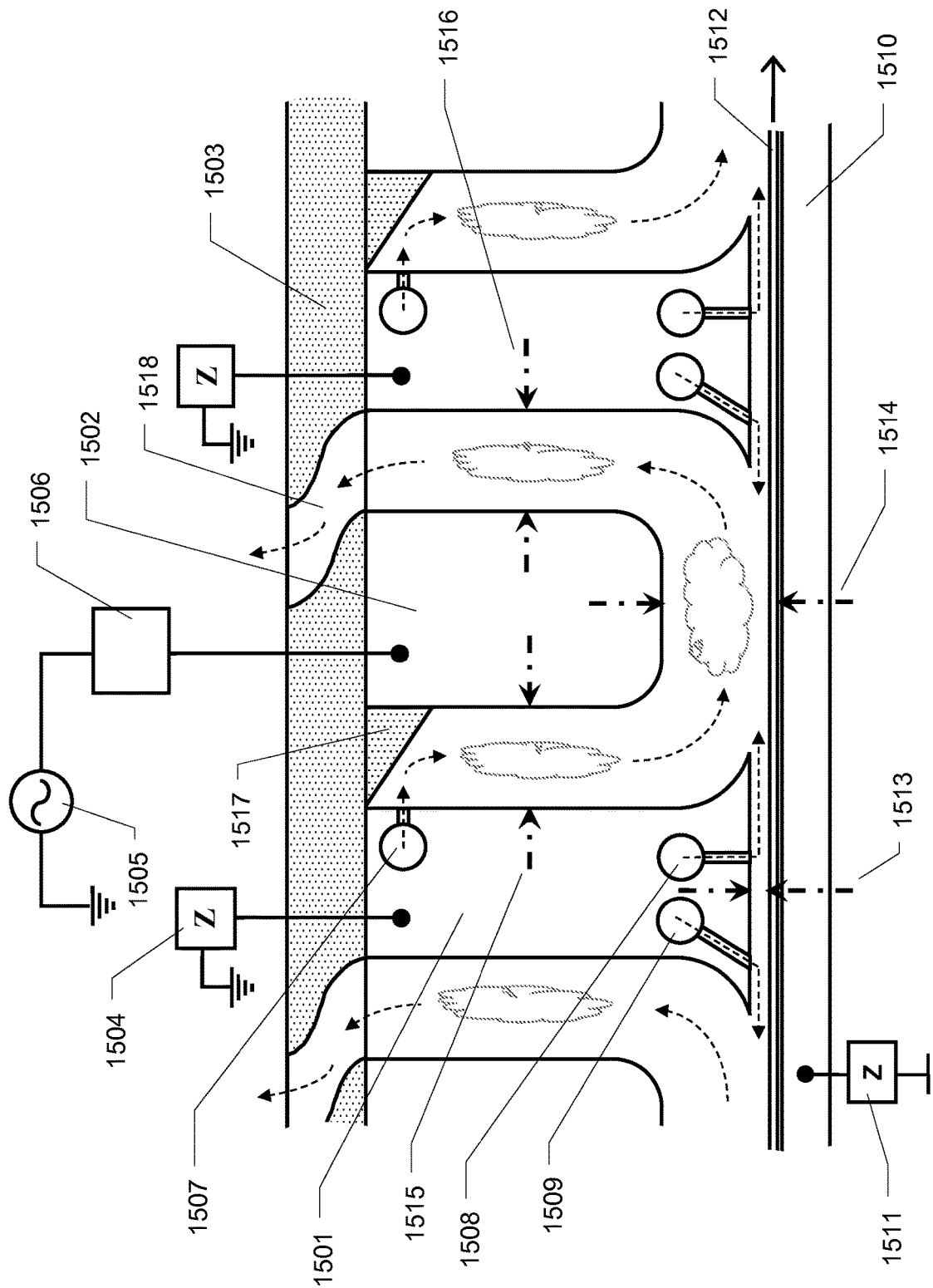
FIG. 15 depicts a diagram illustrating in cross-section an exemplary configuration of a two electrode consisting of an un-powered electrode and a powered electrode. In this exemplary configuration the non-powered electrode provides the ability to separate the powered electrodes, form a continuous gas flow path on both sides of the powered electrodes, provide gas injection points, and create regions free of reactive radicals next to the substrate surface.

In FIG. 15 is shown a configuration of the system in which there is a single powered electrode 1502 surrounded by non-powered electrodes such as 1501 on both sides which are grounded through a small complex impedance 1504 in each plasma source. The electrodes are supported by an insulating support 1503. The powered electrode 1502 is provided ac power by the supply 1505 through a coupling network 1506, which greatly reduces the reflected power going back into the supply 1505 from the electrode 1502. Reactant gas is provided to a reservoir or manifold 1507 in each non-powered electrode that injects the gas into the channel between the grounded electrode and the powered electrode such that it flows downward toward the substrate 1512. There may be in some embodiments an angled baffle 1517 to direct the gas to flow downward with minimal gas recirculation. Precursor gas may be supplied, in some cases diluted with an inert gas, to manifold 1508 so that it flows directly to the substrate in an environment with little or no plasma. This is due to the very small gap 1513 between grounded electrode and substrate. There also may be an inert gas injected from reservoir 1509 into that same gap 1513 so that it flows mainly into the source to the left of the central source in the FIG. 15. This gas also may serve to greatly reduce the flow of precursor gas from the manifold 1508 into the flow stream to the left of electrode 1501. The purpose of this configuration is to apply precursor directly to the substrate in a non-plasma environment so that the precursor may avoid reacting with the reactant when it is initially on the substrate surface. This increases the surface mobility of the silicon or metal containing species, which makes the coating more "conformal" over all exposed surfaces on the substrate, regardless of whether they are re-entrant or sidewalls of particles or holes in the surface. The support for the substrate 1510 is grounded through a small impedance 1511 and may or may not be dc connected to ground. The minimum gap between the powered electrode and the substrate 1514 is in some embodiments less than the width of electrode 1502, while the minimum gap 1515 between electrode 1502 and grounded electrode 1501 may be less than the height of electrode 1502. The gaps 1514 and 1515 may be between 5 mm and 40 mm in size and the ratio of their sizes may be between about ⅓ and 3. The gap 1516 may be larger than either 1514 or 1515 in some embodiments so that the plasma power in the exhaust channel which flows through such gap may be less than that in the region between powered electrode and substrate and between powered electrode 1502 and grounded electrode 1501. In some embodiments the preferred ratio of minimum gap 1514 to minimum gap 1515 may be greater than 1 but less than 2 so that the greatest power density is in the plasma between powered electrode and grounded electrode—which serves to improve the activation rate of the reactant gas in channel 1518. In some embodiments this ratio is less than 1 but greater than 0.5 so that the power in the gap next to the substrate is greater to provide increased ion bombardment of the substrate.

Figure 16:
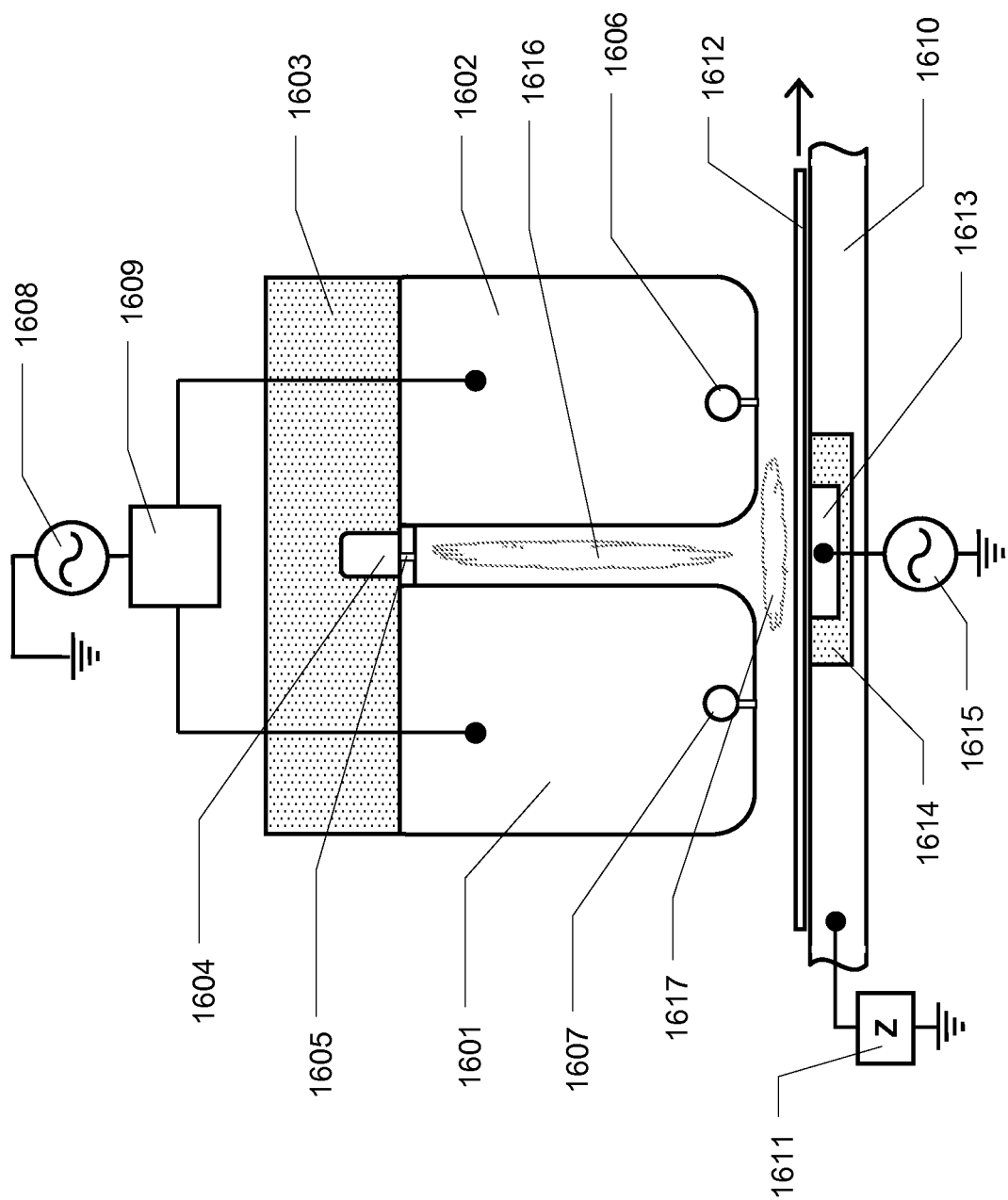
FIG. 16 depicts a diagram of plasma source with precursor injection downward from electrodes toward the substrate and a single lower electrode underneath the gap between the two upper electrodes.

FIG. 16 shows a plasma source that may be used for deposition of dielectric or conducting films. This source in some embodiments may have a straight and essentially constant gap between essentially rectangular electrodes, as shown with rounded corners, or in some embodiments include electrodes having varying gaps between upper electrodes as shown in FIG. 3 and FIG. 4. The ac power provided to the three electrodes may in some embodiments be as shown in FIG. 11 or in some embodiments as shown in FIG. 12 where a single power supply provides for all. In some embodiments ac power may be provided by separate and independently controllable ac power supplies one for the two upper electrodes and a separate one for the single lower electrode. The ac frequencies of said two power supplies may be the same or different. Shown are two electrodes, 1601 and 1602 that are powered by a single ac power supply 1608 through a network 1609 that may include impedance matching, transformer and/or power splitting so that said electrodes are provided roughly equal voltages, currents and amounts of ac power. In some embodiments said voltages and ac currents for said electrodes may be out of phase with each other so that there may be a voltage difference between them resulting in an ac electrical field between the electrodes that sustains a plasma 1616 therein. Said electrodes are supported by an insulating standoff 1603 which has a reservoir 1604 for gas to be injected through at least one nozzle 1605, where said gas may contain at least one reactant such as oxygen, nitrogen, ammonia, carbon dioxide, water vapor, nitrous oxide and may also contain an inert gas or gases such as helium or argon. The precursor gas is supplied to reservoirs 1606 and 1607 within the two electrodes and is injected toward the substrate into the volume between the substrate 1612 and said electrodes. A lower electrode 1613 that is insulated from the pedestal 1610 by a dielectric liner 1614 is provided ac power from a supply 1615. Said electrode is adjacent the opposite side of the substrate from that facing the upper electrodes. The electrode may be symmetrical with respect to the midplane of the plasma source—about which the electrodes may be roughly symmetrically positioned. The width of said lower electrode in some embodiments may be narrow so that it spans at least the gap between the upper electrodes. Said electrode in some embodiments, at a maximum, may have such width that it extends from a centimeter to the left of the injector for manifold 1607 to a centimeter to the right of the injector for manifold 1606. In some embodiments the left edge of the lower electrode does not extend further left than the left edge of the electrode 1601, and at the same time does not extend further to the right than the right edge of the upper electrode 1602. In said embodiments the width of the lower electrode is less than the width of the source itself and its area is less than the combined areas of the upper electrodes 1601 and 1602.

In some embodiments the upper power supply for a source as in FIG. 16 may use at least a supply of ac power having higher RF frequency or VHF frequency in the range between 27.12 MHz and 160 MHz, while the power supply for the lower electrode may use frequencies in the range between about 1 MHz and 27.12 MHz. Higher frequencies may be used for upper electrodes so that the rate of activation between electrodes is more efficient while ion bombardment of electrodes is less. On the other hand, lower RF or VHF excitation frequencies are preferred for the lower electrode since power is preferred to be put preferably into ion bombardment of the substrate rather than dissociation or ionization of the gas adjacent the substrate. One or multiple ac supplies providing electric power having different ac frequencies may be combined for either the upper electrodes or for the lower electrode or both. For example, power to the upper electrodes may include the combination of 1 MHz and 40 MHz with the relative RF phase of both frequencies for both electrodes being between about 15° and 180°.

Figure 17:
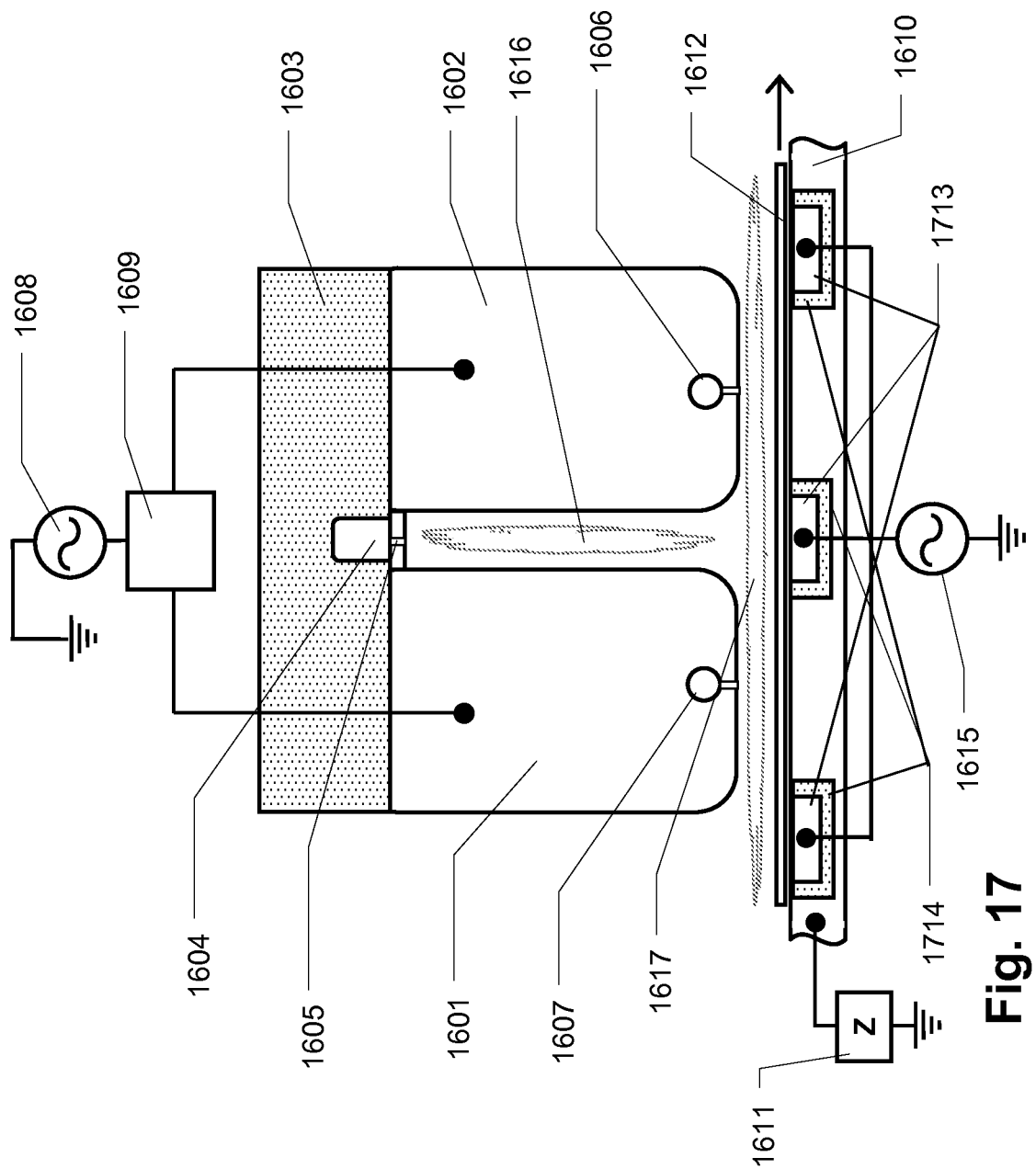
FIG. 17 depicts a diagram of a plasma source with precursor injection downward toward the substrate from both of two upper electrodes, and there are multiple small lower electrodes under substrate within this source.

A source configuration with multiple lower electrodes is shown in FIG. 17. The upper electrodes and parts of the drawing are shown identical to those in FIG. 16 and may be of varying design as they are for FIG. 16. In FIG. 17 there are multiple lower electrodes for each source. Lower electrodes 1713 are supported within pedestal 1610 within insulating housings 1714. The three electrodes 1713 are shown powered in parallel by the single source of RF or VHF power 1615. Said electrodes 1713 may in some embodiments be narrower than an upper electrode such as 1601 but at a minimum are wider than the gap between the upper electrodes 1601 and 1602. Said electrodes may be positioned in some embodiments below the gaps between electrodes as shown in FIG. 17. Alternatively in some embodiments said electrodes may be positioned so that the central electrode is below the gap between upper electrodes while the left and right lower electrodes may be positioned directly below the injector nozzles for precursor gases shown as 1606 and 1607.

Figure 18:
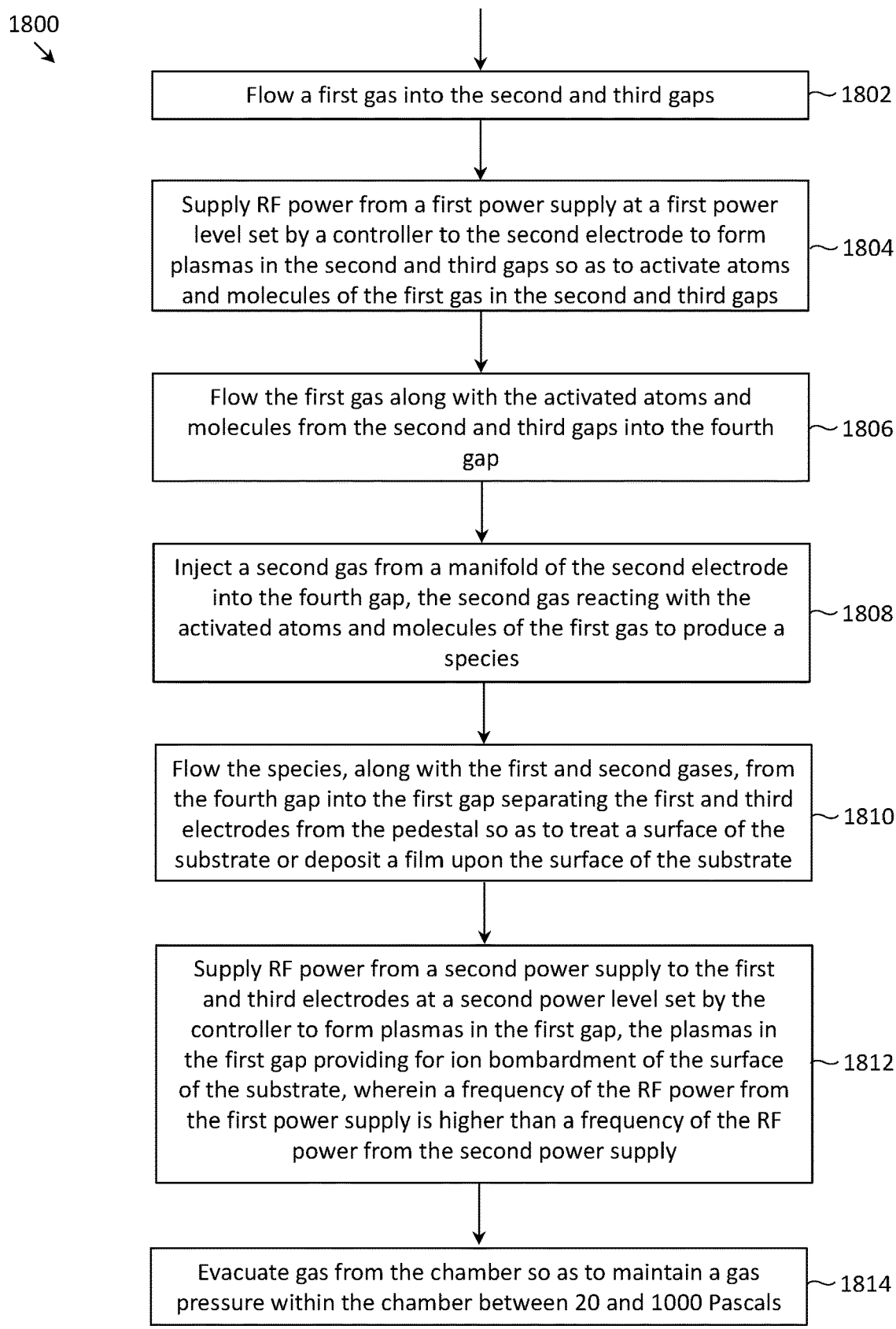
FIG. 18 depicts a flow diagram of a method for operating the three electrode source depicted in FIG. 9(B), in accordance with one embodiment of the invention.

FIG. 18 depicts a flow diagram 1800 of a method for operating the three electrode source depicted in FIG. 9(B), in accordance with one embodiment of the invention. The method may be directed to a plasma-based processing of a substrate in a chamber comprising (i) pedestal configured to support a substrate (ii) a plasma genera unit (PGU) having a first electrode, a second electrode and a third electrode, the first and third electrodes separated from the pedestal by a first gap, the first electrode separated from the second electrode by a second gap, the second electrode separated from the third electrode by a third gap, a bottom portion of the first electrode separated from a bottom portion of the third electrode by a fourth gap, and the first and second gaps converging into the fourth gap. Further, a minimum distance from the second electrode to the pedestal may be greater than twice a minimum distance from the first or third electrode to the pedestal.

At step 1802, a first gas (e.g., containing Nitrogen) is flowed into the second and third gaps. At step 1804, radio frequency (RF) power (e.g., with a frequency greater than 13.56 MHz) may be supplied from first power supply at a first power level set by a controller to the second electrode to form plasmas in the second and third gaps so as to activate atoms and molecules of the first gas in the second and third gaps. At step 1806, the first gas along with the activated atoms and molecules may be flowed from the second and third gaps into the fourth gap. At step 1808, a second gas (e.g., containing Silicon) may be injected from a manifold of the second electrode into the fourth gap. The second gas may react with the activated atoms and molecules of the first gas to produce a species. At step 1810, the species, along with the first and second gases, may be flowed from the fourth gap into the first gap separating the first and third electrodes from the pedestal so as to treat a surface of the substrate or deposit a film (e.g., a Silicon Nitride film) upon the surface of the substrate. At step 1812, RF power may be supplied from a second power supply to the first and third electrodes at a second power level set by the controller to form plasmas in the first gap. The plasmas in the first gap may provide for ion bombardment of the surface of the substrate. In one embodiment of the invention, a frequency of the RF power from the first power supply is higher than a frequency of the RF power from the second power supply. At step 1814, gas may be evacuated from the chamber so as to maintain a gas pressure within the chamber between 20 Pascals and 1000 Pascals.

In one embodiment of the invention, the RF power supplied to the plasmas in the first gap may be controlled at a first level and the RF power supplied to the plasmas in second and third gaps may be controlled at a second level such that a film is deposited on the substrate surface.

In one embodiment of the invention, a power density of the plasmas in the second and third gaps may be greater than a power density of the plasmas in the first gap for at least part of a duration of a process in which silicon nitride is deposited on the substrate.

Figure 19:
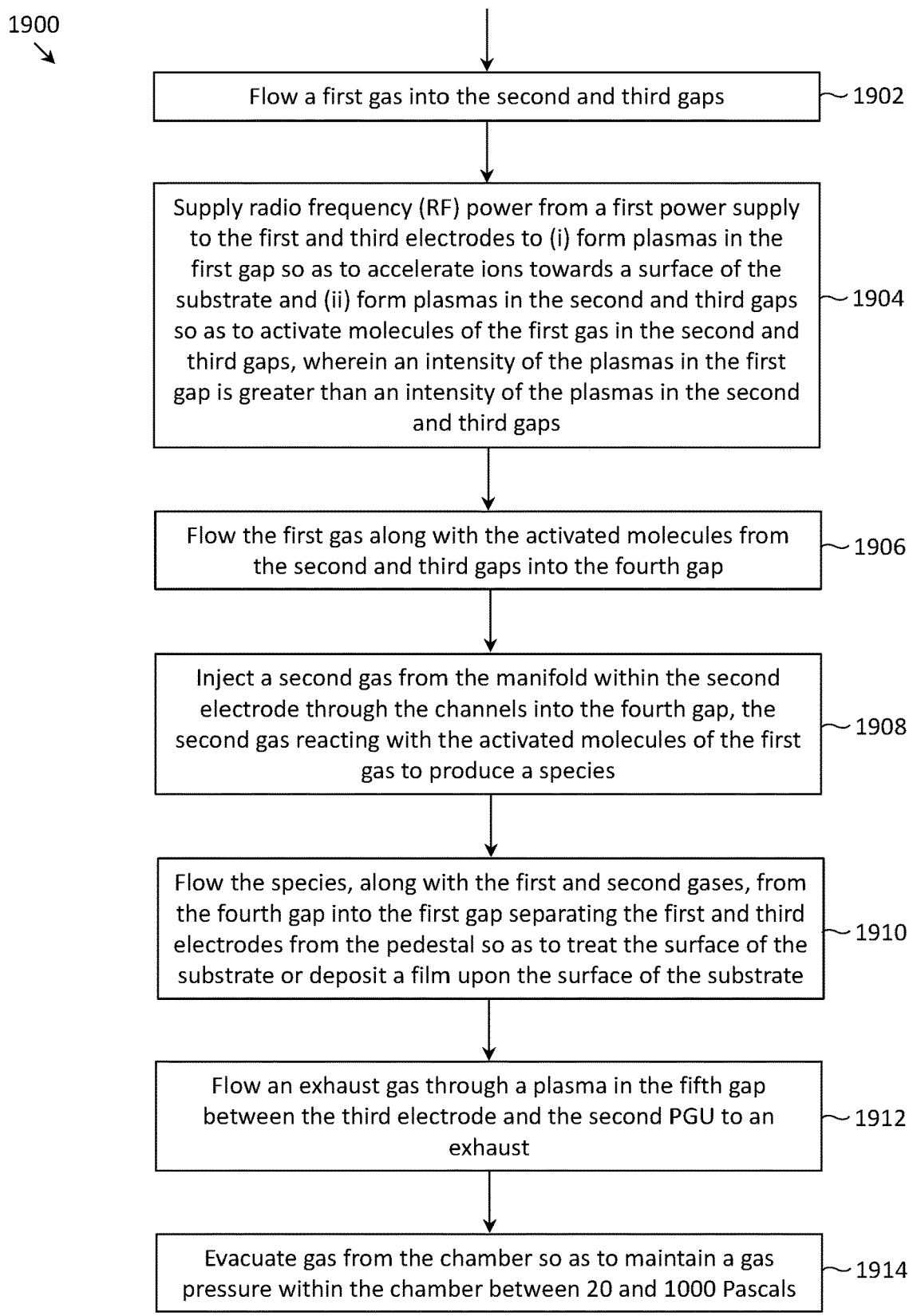
FIG. 19 depicts a flow diagram of a method for operating the three electrode source depicted in FIG. 9(A), in accordance with one embodiment of the invention.

In one embodiment of the invention, a phase of an RF voltage on the first electrode may be equal to a phase of an RF voltage on the third electrode FIG. 19 depicts a flow diagram 1900 of a method for operating the three electrode source depicted in FIG. 9(A), in accordance with one embodiment of the invention. The method may be directed to a plasma-based processing of a substrate in a chamber comprising (i) a pedestal configured to support a substrate, (ii) a first plasma generating unit (PGU) having a first electrode, a second electrode and a third electrode, the first and third electrodes separated from the pedestal by a first gap, the first electrode separated from the second electrode by a second gap, the second electrode separated from the third electrode by a third gap, and a bottom portion of the first electrode separated from a bottom portion of the third electrode by a fourth gap, the first and second gaps converging into the fourth gap, the second electrode including a gas manifold and a plurality of channels connected to the fourth gap, and (iii) a second PGU, a fifth gap formed between the third electrode of the first PGU and the second PGU. Further, a minimum distance from the second electrode to the pedestal may be greater than twice a minimum distance from the first or third electrode to the pedestal.

At step 1902, a first gas (e.g., containing Nitrogen) may be flowed into the second and third gaps. At step 1904, radio frequency (RF) power may be supplied from a first power supply to the first and third electrodes to (i) form plasmas in the first gap so as to accelerate ions towards a surface of the substrate and (ii) form plasmas in the second and third gaps so as to activate molecules of the first gas in the second and third gaps. An intensity of the plasmas in the first gap may be greater than an intensity of the plasmas in the second and third gaps. At step 1906, the first gas along with the activated molecules may be flowed from the second and third gaps into the fourth gap. At step 1908, a second gas (e.g., containing Silicon) may be flowed from the manifold within the second electrode through the channels into the fourth gap. The second gas may react with the activated molecules of the first gas to produce a species. At step 1910, the species, along with the first and second gases, may be flowed from the fourth gap into the first gap separating the first and third electrodes from the pedestal so as to treat the surface of the substrate or deposit a film e.g., a Silicon Nitride film) upon the surface of the substrate. At step 1912, an exhaust gas (e.g., containing byproducts of the reaction, unreacted gas, etc.) pray be flowed through a plasma in the fifth gap between the third electrode and the second PGU to an exhaust. The plasma may reduce gas phase particles by forming stable deposits on electrodes 902 and 909. At step 1914, gas may be evacuated from the chamber so as to maintain a gas pressure within the chamber between 20 Pascals and 1000 Pascals.

In one embodiment of the invention, RF voltages on the first and third electrodes may be equal to one another. In an alternative embodiment of the invention, RF voltages on the first and third electrodes may be opposite to one another in magnitude.

Figure 20:
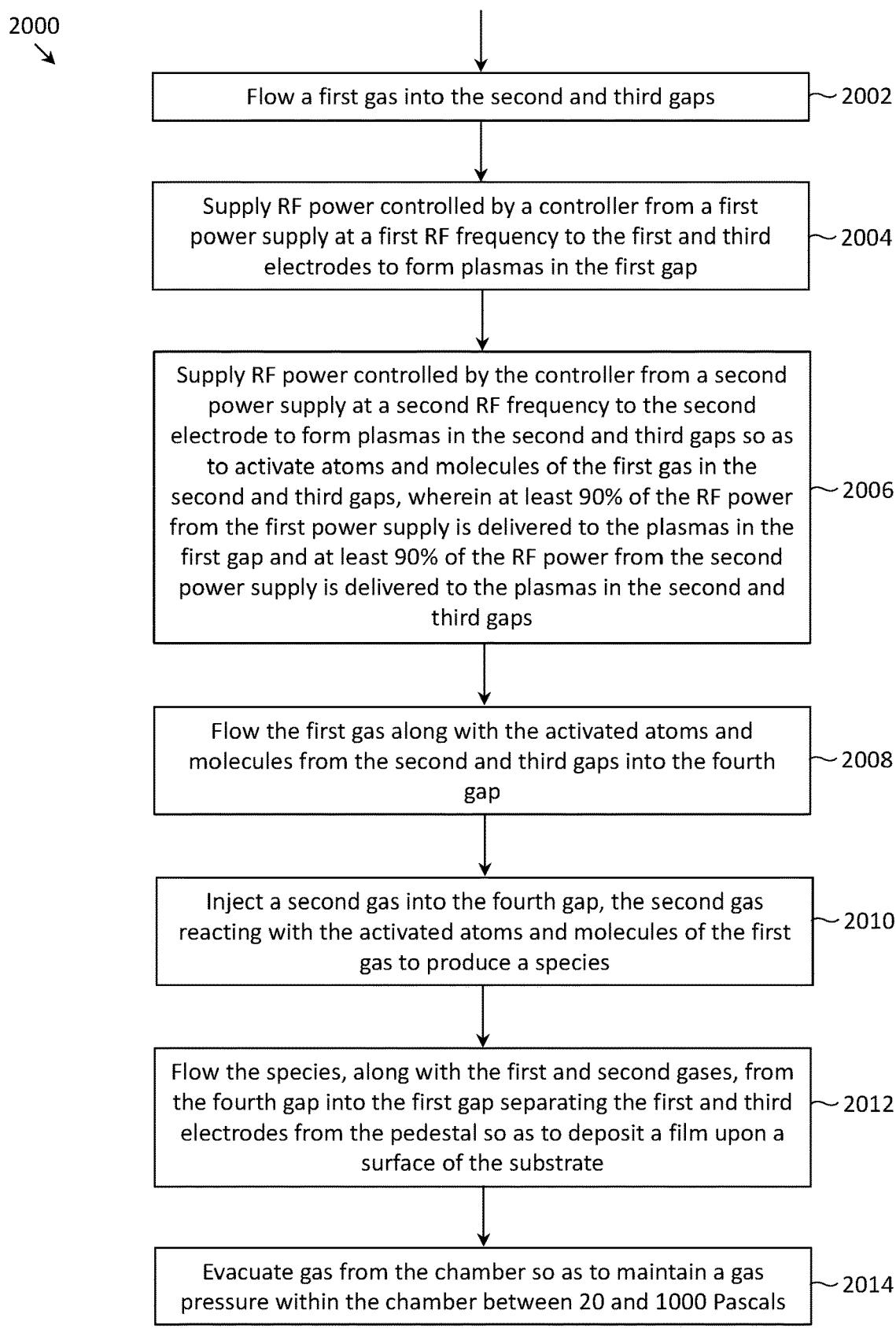
FIG. 20 depicts a flow diagram of a method for operating the three electrode source depicted in FIG. 9(B), in accordance with one embodiment of the invention.

FIG. 20 depicts flow diagram 2000 of a method for operating the three electrode source depicted in FIG. 9(B), in accordance with one embodiment of the invention. The method may be directed to a plasma-based processing of a substrate in a chamber comprising (i) a pedestal configured to support a substrate and (ii) a plasma generating unit (PGU) having a first electrode, a second electrode and a third electrode, the first and third electrodes separated from the pedestal by a first gap, the first electrode separated from the second electrode by a second gap, the second electrode separated from the third electrode by a third gap, and a bottom portion of the first electrode separated from a bottom portion of the third electrode by a fourth gap, the first and second gaps converging into the fourth gap, a minimum width of the fourth gap being greater than a sum of respective widths of the second and third gaps, the fourth gap defining a volume disposed below the second electrode such that a minimum distance from the second electrode to the pedestal is more than twice a minimum distance from the first or third electrodes to the pedestal.

At step 2002, first gas containing Nitrogen) may be flowed into the second and third gaps. At step 2004, radio frequency (RF) power controlled by a controller from a first power supply at a first RF frequency may be supplied to the first and third electrodes to form plasmas in the first gap. At step 2006, RF power controlled by the controller from a second power supply at a second RF frequency may be supplied to the second electrode to form plasmas in the second and third gaps so as to activate atoms and molecules of the first gas in the second and third gaps. At least 90% of the RF power from the first power supply may be delivered to the plasmas in the first gap and at least 90% of the RF power from the second power supply may be delivered to the plasmas in the second and third gaps. To provide for such power delivery, a voltage amplitude on the first and third electrodes may be greater than 50 Volts root mean square (RMS) at the first frequency of said first power supply, and less than 15 Volts at the second frequency of the second power supply. Further, the voltage amplitude on the second electrode at the second frequency of the second power supply may be greater than 30 Volts RMS and the voltage amplitude on the second electrode at the first RF frequency may be less than 20 Volts RMS. At step 2008, the first gas may be flowed along with the activated atoms and molecules from the second and third gaps into the fourth gap. At step 2010, a second gas (e.g., containing Silicon) may be injected into the fourth gap. The second gas may react with the activated atoms and molecules of the first gas to produce a species. At step 2012, the species, along with the first and second gases, may be flowed from the fourth gap into the first gap separating the first and third electrodes from the pedestal so as to deposit a film (e.g., Silicon Nitride film) upon a surface of the substrate. At step 2014, gas from the chamber may be evacuated so as to maintain a gas pressure within the chamber between 20 Pascals and 1000 Pascals.

In one embodiment of the invention, a power density of the plasmas in the second and third gaps may be greater than a power density of the plasmas in the first gap In one embodiment of the invention, more than 50% of the species may be deposited on the substrate.

In one embodiment of the invention, RF voltages on the first and third electrodes may be equal to one another. In an alternative embodiment of the invention, RF voltages on the first and third electrodes may be opposite to one another in magnitude.

Figure 21:
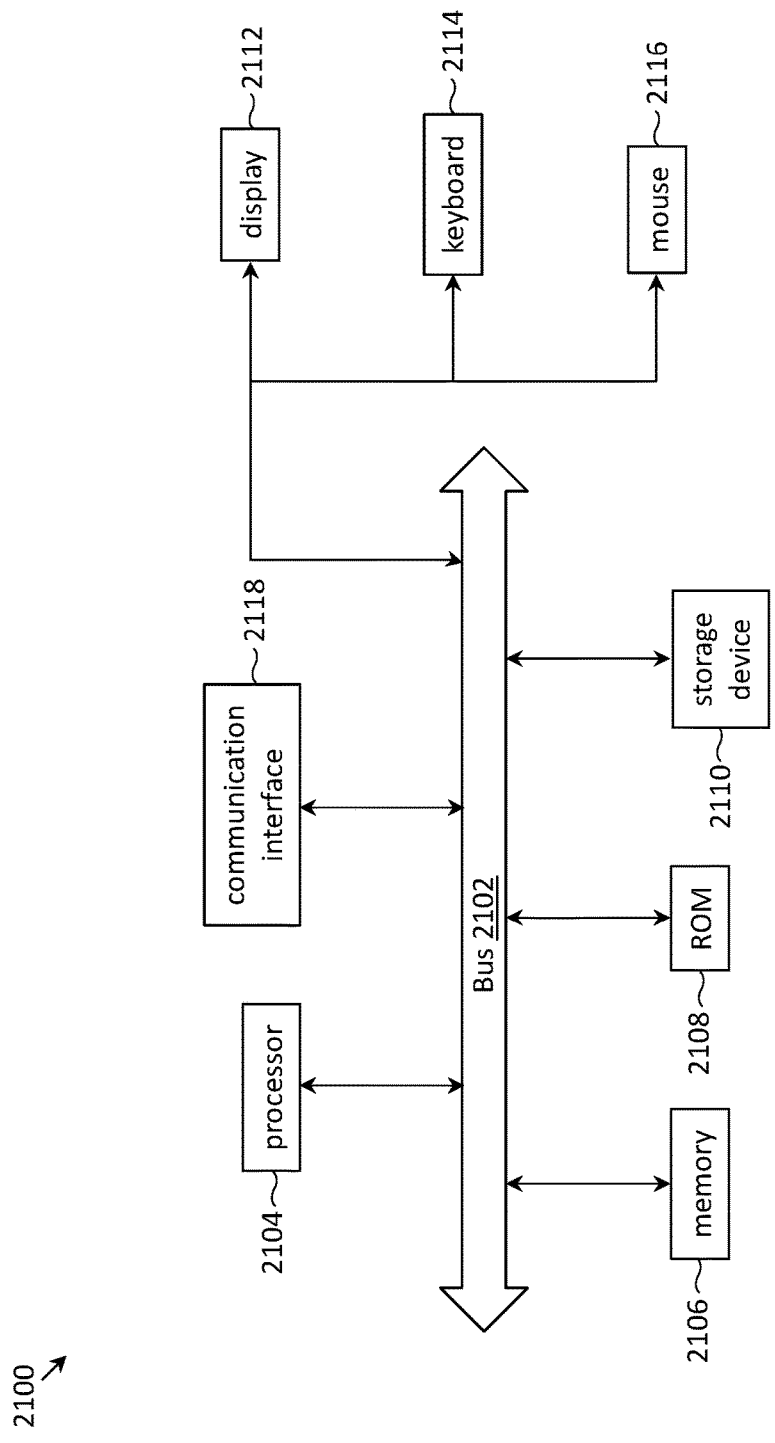
FIG. 21 depicts components of a computer system in which computer readable instructions instantiating the methods of the present invention may be stored and executed.

As is apparent from the foregoing discussion, aspects of the present invention involve the use of various computer systems and computer readable storage media having computer-readable instructions stored thereon. FIG. 21 provides an example of a system 2100 that may be representative of any of the computing systems (e.g., controller 921) discussed herein. Examples of system 2100 may include a smartphone, a desktop, a laptop, a mainframe computer, an embedded system, etc. Note, not all of the various computer systems have all of the features of system 2100. For example, certain ones of the computer systems discussed above may not include a display inasmuch as the display function may be provided by a client computer communicatively coupled to the computer system or a display function may be unnecessary. Such details are not critical to the present invention.

System 2100 includes a bus 2102 or other communication mechanism for communicating information, and a processor 2104 coupled with the bus 2102 for processing information. Computer system 2100 also includes a main memory 2106, such as a random access memory (RAM) or other dynamic storage device, coupled to the bus 2102 for storing information and instructions to be executed by processor 2104. Main memory 2106 also may be used for storing temporary variables or other intermediate information during execution of instructions to be executed by processor 2104. Computer system 2100 further includes a read only memory (ROM) 2108 or other static storage device coupled to the bus 2102 for storing static information and instructions for the processor 2104. A storage device 2110, for example a hard disk, flash memory-based storage medium, or other storage medium from which processor 2104 can read, is provided and coupled to the bus 2102 for storing information and instructions (e.g., operating systems, applications programs and the like).

Computer system 2100 may be coupled via the bus 2102 to a display 2112, such as a flat panel display, for displaying information to a computer user. An input device 2114, such as a keyboard including alphanumeric and other keys, may be coupled to the bus 2102 for communicating information and command selections to the processor 2104. Another type of user input device is cursor control device 2116, such as a mouse, a trackpad, or similar input device for communicating direction information and command selections to processor 2104 and for controlling cursor movement on the display 2112. Other user interface devices, such as microphones, speakers, etc. are not shown in detail but may be involved with the receipt of user input and/or presentation of output.

The processes referred to herein may be implemented by processor 2104 executing appropriate sequences of computer-readable instructions contained in main memory 2106. Such instructions may be read into main memory 2106 from another computer-readable medium, such as storage device 2110, and execution of the sequences of instructions contained in the main memory 2106 causes the processor 2104 to perform the associated actions. In alternative embodiments, hard-wired circuitry or firmware-controlled processing units may be used in place of or in combination with processor 2104 and its associated computer software instructions to implement the invention. The computer-readable instructions may be rendered in any computer language.

In general, all of the above process descriptions are meant to encompass any series of logical steps performed in a sequence to accomplish a given purpose, which is the hallmark of any computer-executable application. Unless specifically stated otherwise, it should be appreciated that throughout the description of the present invention, use of terms such as "processing", "computing", "calculating", "determining", "displaying", "receiving", "transmitting" or the like, refer to the action and processes of an appropriately programmed computer system, such as computer system 2100 or similar electronic computing device, that manipulates and transforms data represented as physical (electronic) quantities within its registers and memories into other data similarly represented as physical quantities within its memories or registers or other such information storage, transmission or display devices.

Computer system 2100 also includes a communication interface 2118 coupled to the bus 2102. Communication interface 2118 may provide a two-way data communication channel with a computer network, which provides connectivity to and among the various computer systems discussed above. For example, communication interface 2118 may be a local area network (LAN) card to provide a data communication connection to a compatible LAN, which itself is communicatively coupled to the Internet through one or more Internet service provider networks. The precise details of such communication paths are not critical to the present invention. What is important is that computer system 2100 can send and receive messages and data through the communication interface 2118 and in that way communicate with hosts accessible via the Internet. It is noted that the components of system 2100 may be located in a single device or located in a plurality of physically and/or geographically distributed devices.

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

What is claimed is:

1. A method for plasma-based processing of a substrate in a chamber comprising (i) a pedestal configured to support a substrate and (ii) a plasma generating unit (PGU) having a first electrode, a second electrode and a third electrode, the first and third electrodes separated from the pedestal by a first gap, the first electrode separated from the second electrode by a second gap, the second electrode separated from the third electrode by a third gap, a bottom portion of the first electrode separated from a bottom portion of the third electrode by a fourth gap, and the first and second gaps converging into the fourth gap, the method comprising:
    flowing a first gas into the second and third gaps;
    supplying radio frequency (RF) power from a first power supply at a first power level set by a controller to the second electrode to form plasmas in the second and third gaps so as to activate atoms and molecules of the first gas in the second and third gaps;
    flowing the first gas along with the activated atoms and molecules from the second and third gaps into the fourth gap;
    injecting a second gas from a manifold of the second electrode into the fourth gap, the second gas reacting with the activated atoms and molecules of the first gas to produce a species;
    flowing the species, along with the first and second gases, from the fourth gap into the first gap separating the first and third electrodes from the pedestal so as to treat a surface of the substrate or deposit a film upon the surface of the substrate;
    supplying RF power from a second power supply to the first and third electrodes at a second power level set by the controller to form plasmas in the first gap, the plasmas in the first gap providing for ion bombardment of the surface of the substrate, wherein a frequency of the RF power from the first power supply is higher than a frequency of the RF power from the second power supply; and
    evacuating gas from the chamber so as to maintain a gas pressure within the chamber between 20 Pascals and 1000 Pascals.

2. The method of claim 1, wherein the RF power supplied to the plasmas in the first gap is controlled at a first level and the RF power supplied to the plasmas in second and third gaps are controlled at a second level such that a film is deposited on the substrate surface.

3. The method of claim 1, wherein a power density of the plasmas in the second and third gaps is greater than a power density of the plasmas in the first gap for at least part of a duration of a process in which silicon nitride is deposited on the substrate.

4. The method of claim 1, wherein the frequency of the RF power from the first power supply is greater than 13.56 MHz.

5. The method of claim 1, wherein the first gas comprises a nitrogen-containing gas, the second gas comprises a silicon-containing gas and the deposited film comprises silicon nitride.

6. The method of claim 1, wherein a minimum distance from the second electrode to the pedestal is greater than twice a minimum distance from the first or third electrode to the pedestal.

7. The method of claim 1, wherein a phase of an RF voltage on the first electrode is equal to a phase of an RF voltage on the third electrode.

8. A method for plasma-based processing of a substrate in a chamber comprising (i) a pedestal configured to support a substrate, (ii) a first plasma generating unit (PGU) having a first electrode, a second electrode and a third electrode, the first and third electrodes separated from the pedestal by a first gap, the first electrode separated from the second electrode by a second gap, the second electrode separated from the third electrode by a third gap, and a bottom portion of the first electrode separated from a bottom portion of the third electrode by a fourth gap, the first and second gaps converging into the fourth gap, the second electrode including a gas manifold and a plurality of channels connected to the fourth gap, and (iii) a second PGU, a fifth gap formed between the third electrode of the first PGU and the second PGU, the method comprising:
    flowing a first gas into the second and third gaps;
    supplying radio frequency (RF) power from a first power supply to the first and third electrodes to (i) form plasmas in the first gap so as to accelerate ions towards a surface of the substrate and (ii) form plasmas in the second and third gaps so as to activate molecules of the first gas in the second and third gaps, wherein an intensity of the plasmas in the first gap is greater than an intensity of the plasmas in the second and third gaps;

flowing the first gas along with the activated molecules from the second and third gaps into the fourth gap;

injecting a second gas from the manifold within the second electrode through the channels into the fourth gap, the second gas reacting with the activated molecules of the first gas to produce a species;

flowing the species, along with the first and second gases, from the fourth gap into the first gap separating the first and third electrodes from the pedestal so as to treat the surface of the substrate or deposit a film upon the surface of the substrate;

flowing an exhaust gas through a plasma in the fifth gap between the third electrode and the second PGU to an exhaust; and evacuating gas from the chamber so as to maintain a gas pressure within the chamber between 20 Pascals and 1000 Pascals.

9. The method of claim 8, wherein the first gas comprises a nitrogen-containing gas and the second gas comprises a silicon-containing gas.

10. The method of claim 8, wherein a minimum distance from the second electrode to the pedestal is greater than a minimum distance from the first or third electrode to the pedestal.

11. The method of claim 9, wherein a film of silicon nitride is deposited on the substrate.

12. The method of claim 9, wherein RF voltages on the first and third electrodes are equal to one another.

13. The method of claim 9, wherein RF voltages on the first and third electrodes are opposite to one another in magnitude.

14. A method for plasma-based processing of a substrate in a chamber comprising (i) a pedestal configured to support a substrate and (ii) a plasma generating unit (PGU) having a first electrode, a second electrode and a third electrode, the first and third electrodes separated from the pedestal by a first gap, the first electrode separated from the second electrode by a second gap, the second electrode separated from the third electrode by a third gap, and a bottom portion of the first electrode separated from a bottom portion of the third electrode by a fourth gap, the first and second gaps converging into the fourth gap, a minimum width of the fourth gap being greater than a sum of respective widths of the second and third gaps, the fourth gap defining a volume disposed below the second electrode such that a minimum distance from the second electrode to the pedestal is more than twice a minimum distance from the first or third electrodes to the pedestal, the method comprising:

flowing a first gas into the second and third gaps;

supplying radio frequency (RF) power controlled by a controller from a first power supply at a first RF frequency to the first and third electrodes to form plasmas in the first gap;

supplying RF power controlled by the controller from a second power supply at a second RF frequency to the second electrode to form plasmas in the second and third gaps so as to activate atoms and molecules of the first gas in the second and third gaps, wherein at least 90% of the RF power from the first power supply is delivered to the plasmas in the first gap and at least 90% of the RF power from the second power supply is delivered to the plasmas in the second and third gaps;

flowing the first gas along with the activated atoms and molecules from the second and third gaps into the fourth gap;

injecting a second gas into the fourth gap, the second gas reacting with the activated atoms and molecules of the first gas to produce a species;

flowing the species, along with the first and second gases, from the fourth gap into the first gap separating the first and third electrodes from the pedestal so as to deposit a film upon a surface of the substrate; and evacuating gas from the chamber so as to maintain a gas pressure within the chamber between 20 Pascals and 1000 Pascals.

15. The method of claim 14, wherein a power density of the plasmas in the second and third gaps is greater than a power density of the plasmas in the first gap.

16. The method of claim 14, wherein more than 50% of the species is deposited on the substrate.

17. The method of claim 14, wherein the first gas comprises a nitrogen-containing gas, the second gas comprises a silicon-containing gas, and the deposited film comprises silicon nitride.

18. The method of claim 14, wherein RF voltages on the first and third electrodes are opposite to one another in magnitude.

19. The method of claim 14, wherein RF voltages on the first and third electrodes are equal to one another.

20. The method of claim 14, wherein a voltage amplitude on the first and third electrodes is greater than 50 Volts root mean square (RMS) at the first frequency of said first power supply, and less than 15 Volts at the second frequency of the second power supply, and wherein the voltage amplitude on the second electrode at the second frequency of the second power supply is greater than 30 Volts RMS and the voltage amplitude on the second electrode at the first RF frequency is less than 20 Volts RMS.

\* \* \* \* \*